United States Patent [19]
Fujiwara et al.

[11] Patent Number: 5,737,273
[45] Date of Patent: Apr. 7, 1998

[54] SENSE AMPLIFIER AND READING CIRCUIT WITH SENSE AMPLIFIER

[75] Inventors: Hideo Fujiwara; Seiji Yamanaka, both of Ikeda; Toshihisa Nagata, Takarazuka; Hiizu Okubo, Nishinomiya, all of Japan

[73] Assignee: Ricoh Company, Ltd., Tokyo, Japan

[21] Appl. No.: 630,929

[22] Filed: Apr. 5, 1996

[30] Foreign Application Priority Data

Apr. 6, 1995 [JP] Japan .................................. 7-081274
Jul. 5, 1995 [JP] Japan .................................. 7-194263

[51] Int. Cl.$^6$ ................................................ H01L 27/10
[52] U.S. Cl. .................. 365/205; 365/189.05; 365/203
[58] Field of Search ........................ 365/205, 189.01, 365/203, 189.05

[56] References Cited

U.S. PATENT DOCUMENTS

| | | | |
|---|---|---|---|
| 5,029,135 | 7/1991 | Okubo | 365/203 |
| 5,291,453 | 3/1994 | Aota et al. | 365/221 |
| 5,495,444 | 2/1996 | Okubo et al. | 365/189.04 |

FOREIGN PATENT DOCUMENTS

| | | | |
|---|---|---|---|
| 60-224197 | 11/1985 | Japan | G11C 17/00 |
| 63-184990 | 7/1988 | Japan | G11C 11/34 |

*Primary Examiner*—Viet Q. Nguyen
*Attorney, Agent, or Firm*—Cooper & Dunham LLP

[57] ABSTRACT

A state control portion causes a sense amplifier portion to be at an active state and for causing the sense amplifier to be at an inactive state. A feedback portion causes the control device to causing the sense amplifier portion to be in the inactive state when a path is formed between a power source and a ground in the sense amplifier. A latch portion holds an output of the sense amplifier output when the path is formed. The state control portion comprises a first transistor acting as a switching device. The feedback portion produces a control signal using an output of the sense amplifier portion and a clock signal obtained from a detection circuit, and supplies the control signal to the first transistor. A second transistor for precharging is connected between the first transistor and the power source.

9 Claims, 16 Drawing Sheets

FIG. 3

| | BL | BLB | SOUT | STATIC PASSING-THROUGH ELECTRIC CURRENT |
|---|---|---|---|---|
| DATA "1" | H | L | H | FLOWS |
| DATA "0" | L | H | L | NOT FLOWS |

FIG.4A
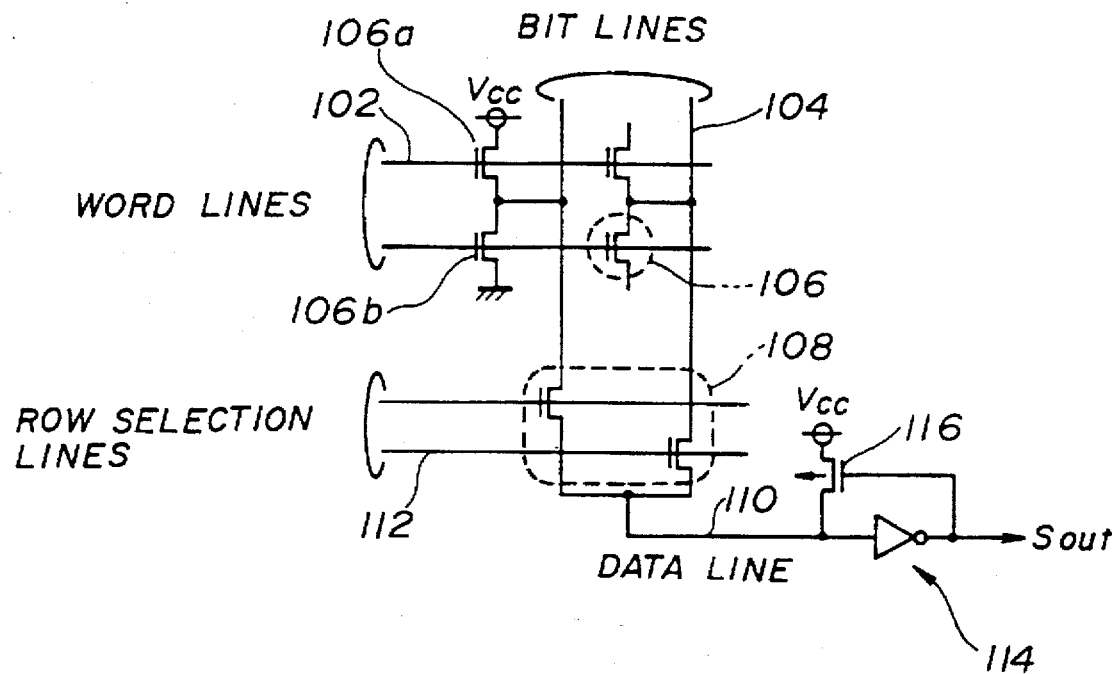
BIT LINES
106a
102
Vcc
104
WORD LINES
106b
106
108
ROW SELECTION LINES
Vcc
116
112
110
DATA LINE
Sout
114
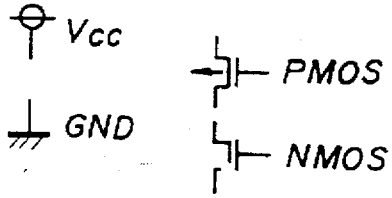
LEGEND:
Vcc
GND
PMOS
NMOS
FIG.4B
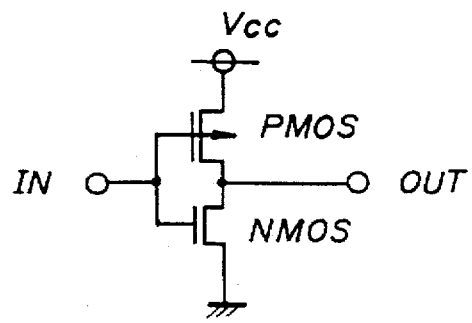
Vcc
PMOS
IN    OUT
NMOS

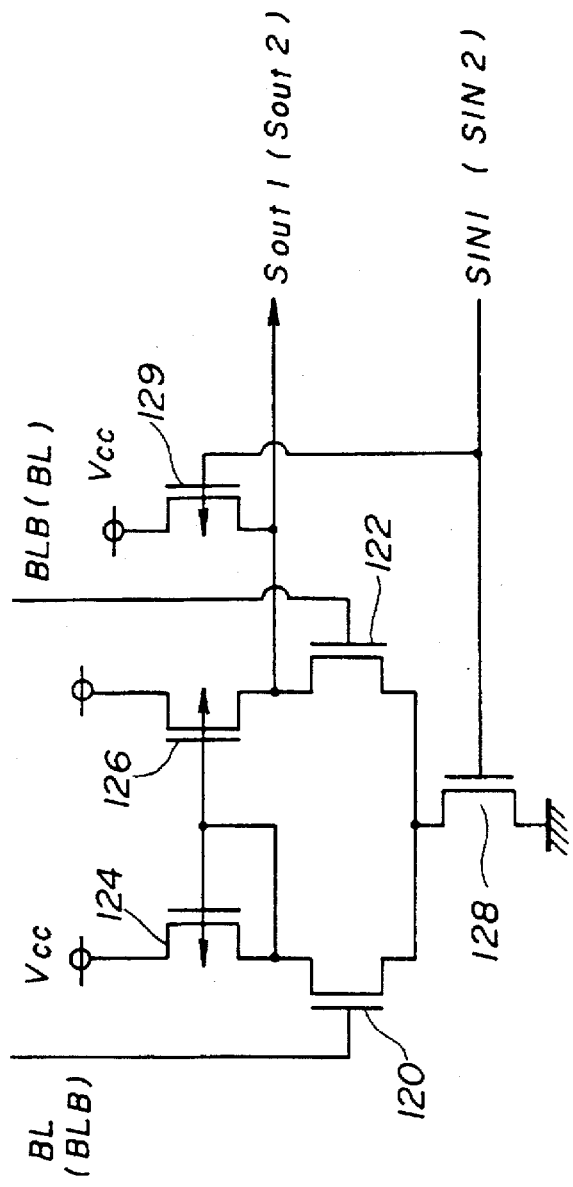

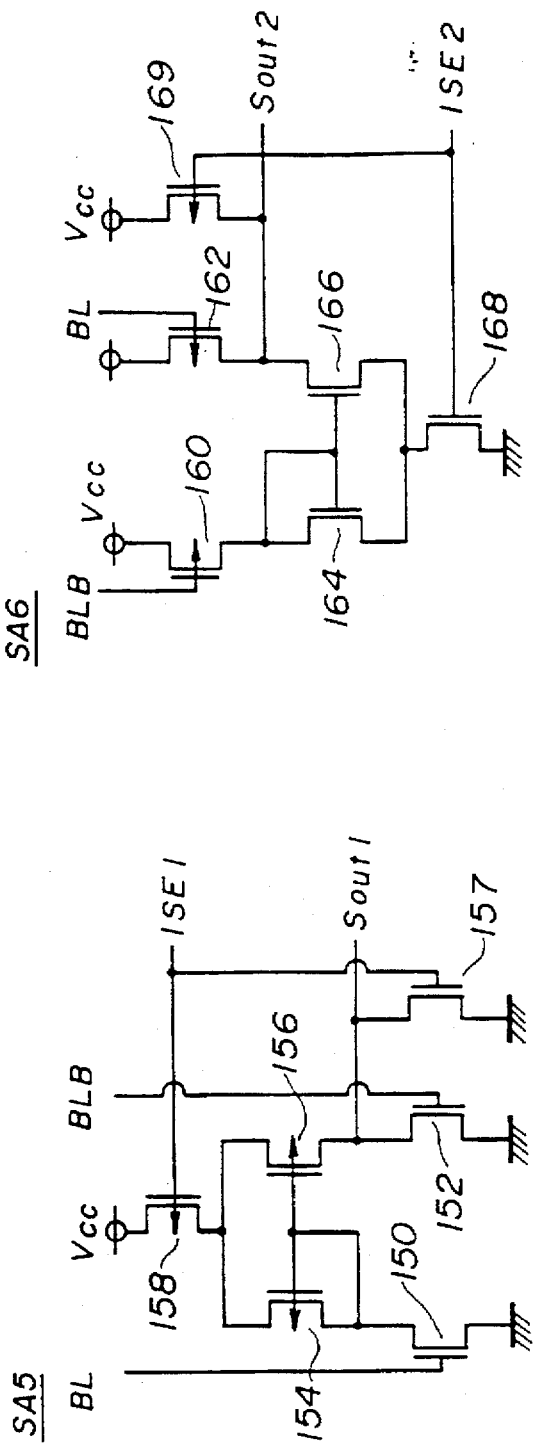

SENSE AMPLIFIER AND READING CIRCUIT WITH SENSE AMPLIFIER

BACKGROUND OF THE INVENTION

1. Field of the Invention

The present invention relates to a sense amplifier and a reading circuit with a sense amplifier, for reading data from a memory cell in a semiconductor memory such as a ROM (Read-Only Memory) or a RAM (Random Access Memory).

2. Description of the Related Art

Recently, a market for portable equipment has been increasing. In order to reduce a weight of battery-driven portable equipment, it is preferable that fewer battery cells are required therefor. For this purpose, it is demanded that semiconductor products used in such portable equipment are driven by a decreased voltage and consume less power. Further, it is also demanded that semiconductor product used therein have performances that will not degrade even though the equipment is carried and used in various environment. Therefore, it is necessary to provide semiconductor products which are driven by a less voltage, consume decreased power and have properties not likely to degrade.

FIG. 1 shows a circuit diagram of a sense amplifier for a ROM in the related art. The sense amplifier includes an inverter $IN_1$ that inverts an electric potential supplied from an output terminal of a memory cell unit 2. The memory cell unit 2 includes a memory cell 50 and a memory selection transistor 51. Further, the sense amplifier includes an N-channel transistor $Tr_1$. An output of the inverter $IN_1$ is input to a gate of the transistor $Tr_1$ and a source of the transistor $Tr_1$ is connected to the output terminal of the memory cell unit 2. The sense amplifier further includes a P-channel transistor $Tr_2$ used for a loading operation. A drain of the transistor $Tr_1$ is connected to a drain of the transistor $Tr_2$. In the sense amplifier, a point at which the transistors $Tr_1$ and $Tr_2$ are connected with one another is an output terminal OUT. With regard to the circuit, see Japanese Patent Publication No. 5-44759. For such a type of sense amplifier, a timing clock signal is not required.

In the sense amplifier, when the memory cell 50 is in its OFF state, an electric potential V(A) shown in FIG. 1 gradually increases. Then, when $V(A)=V(B)-V_{TH}$, where $V_{TH}$ is an operation electric potential of the transistor $Tr_1$, the transistor $Tr_1$ comes to be in its OFF state. When the transistor $Tr_1$ comes to be in the OFF state, a High-level electric potential is supplied from the output terminal OUT. Thus, the memorized content is read out from the memory cell 50 through the sense amplifier. When the memory cell 50 is in its ON state, the electric potential V(A) decreases, and when $V(A)<V(B)-V_{TH}$, the transistor $Tr_1$ comes to be in its ON state. Thereby, a Low-level electric potential is supplied from the OUT terminal. Thus, the memorized content is read out from the memory cell 50 through the sense amplifier.

FIG. 2 shows a circuit diagram of a current-mirror-type sense amplifier in the related art. In this sense amplifier, mutually complementary output signals which are read from a memory cell (not shown in the figure) are received by lines BL and BLB. The term 'complementary' means such a condition that, when one line of a pair of signal lines has a signal of a High level, the other line of the pair of signal lines has a signal of Low level, throughout this specification. Gates of N-channel transistors $M_3$ and $M_4$ are connected to the lines BL and BLB, respectively. The transistors $M_3$ and $M_4$ are grounded via a transistor $M_5$. A SIN (chip enable signal) is input to a gate of the transistor $M_5$. A drain of the transistor $M_3$ is connected to a gate and a drain of a P-channel transistor $M_I$. A drain of the transistor $M_4$ is connected to a gate and a drain of a P-channel transistor $M_2$. Each of the transistors $M_1$ and $M_2$ is connected to a power source as shown in the figure. In the sense amplifier shown in FIG. 2, a point at which the transistors $M_2$ and $M_4$ are connected is an output terminal SOUT. With regard to this circuit, see Japanese Laid-Open Patent Application 63-184990.

The sense amplifier show in FIG. 2 operates as shown in FIG. 3. When data "1" of the memory cell (not shown in the figure) is read, a High-level signal is supplied to the line BL and a Low-level signal is supplied to the line BLB. As a result, a High-level signal is supplied at the terminal SOUT. When data "0" of the memory cell is read, a Low-level signal is supplied to the line BL and a High-level signal is supplied to the line BLB. As a result, a Low-level signal is supplied at the terminal SOUT.

In the sense amplifier shown in FIG. 1, when the memory cell 50 is in the OFF state, the transistor $Tr_1$ is in the OFF state. Thereby, a static passing-through electric current (referred to as a passing-through electric current which is not a preferable one and continuously flows approximately with a static level, hereinafter), which flows through a path including the transistor $Tr_2 \rightarrow$ the transistor $Tr_1 \rightarrow$ the transistor $51 \rightarrow$ the memory cell $50 \rightarrow$ the ground, hardly flows. However, when the memory cell 50 is in the ON state, the transistor $Tr_1$ is in the ON state. Thereby, the static passing-through electric current, which flows through the path including the transistor $Tr_2 \rightarrow$ the transistor $Tr_1 \rightarrow$ the transistor $51 \rightarrow$ the memory cell $50 \rightarrow$ the ground, significantly flows. Therefore, power consumption is problematically large.

Further, when the state in which data reading is performed on the memory cell in the ON state is changed to the state in which data reading is performed on the memory cell in the OFF state, the electric potential V(A) gradually increases and the electric potential V(B) decreases. Then, $V(B)=V(A)+V_{TH}$. Until then, the transistor $Tr_1$ does not come to be in the OFF state. Therefore, a long access time is required.

Further, in the current-mirror-type sense amplifier shown in FIG. 2, when the data "1" is read, a significant static passing-through electric current flows and thereby power consumption is large.

An object of the present invention is to provide a sense amplifier which consumes low power and has a short access time.

FIG. 4A shows an example of a reading circuit used for reading data from a mask ROM. ROM memory cells 106, 106a and 106b are provided at points at which a plurality of word lines 102 cross a plurality of bit lines 104. In order to write information into each memory cell 106, 106a or 106b, a source electric potential of a memory cell is fixed at a power source electric potential Vcc as for the memory cell 106a shown in the figure, or a source electric potential of a memory cell is fixed at the ground electric potential as for the memory cell 106b. In FIG. 4A, the two memory cells 106 on the right are in states on which programing has not been performed. Therefore, each of these memory cells is fixed neither at the power source electric potential nor at the ground electric potential. The bit lines 104 are connected to a data line 110 via MOS transistors provided in a row selection circuit 108. A selection signal is supplied to a gate of a MOS transistor in the row selection circuit 108 via a row selection line 112. A reading circuit 114 which includes a CMOS inverter is provided for the data line 110. An output signal of the inverter is supplied as a read signal $S_{OUT}$.

When the reading circuit 114 is used for reading data from a memory cell, according to an external input signal, a predetermined word line 102 is selected, and a predetermined bit line 104 is selected through the row selection circuit 108. Thus, a memory cell such as the memory cell 106 is selected. Data of the selected memory cell 106 is transferred to the data line 110 from the bit line 104, and to the reading circuit 114. At this time, if a source of the memory cell 106 is fixed at Vcc as in the case of the memory cell 106a, the data line 110 is at a High level. The reading circuit 114 senses the High level, and thereby outputs a Low level. If the source of the memory cell 106 is fixed at the ground as in the case of the memory cell 106b, the data line 110 is at the Low level. Thereby, the reading circuit 114 senses the Low level and outputs a High level.

If the source of the memory cell 106 is fixed at Vcc, the High level supplied to the bit line 104 and the data line 110 is a level of (Vcc-Vtc). Vtc is a threshold voltage of the memory cell 106. Therefore, a static passing-through electric current flows through a first stage of the reading circuit 114, in this example, the inverter.

For example, the inverter includes a circuit including PMOS and NMOS transistors as shown in FIG. 4B. In such a circuit, when a High level is supplied to an input terminal IN, the NMOS transistor is in its ON state and the PMOS transistor is in its OFF state. As a result, a Low level is supplied from an output terminal OUT. When a Low level is supplied to an input terminal IN, the NMOS transistor is in its OFF state and the PMOS transistor is in its ON state. AS a result, a High level is supplied from the output terminal OUT. During these operations, there is no occasion in which the two PMOS and NMOS transistors are simultaneously in the ON states. Therefore, no static passing-through electric current flows through the inverter. However, if the High level supplied to the input terminal IN is not sufficiently high, the two PMOS and NMOS transistors are simultaneously in approximately the ON states. Therefore, a static passing-through electric current flows through the inverter.

In order to prevent such a static passing-through electric current from flowing, as shown in FIG. 4A, a PMOS transistor 116 is provided between an input side of the reading circuit 114 and the Vcc terminal. A gate of the transistor 116 is connected to an output side of the reading circuit 114. Thereby, when data is read out from the memory cell 106 having the source fixed at Vcc, an electric potential of the data line 110 is raised to the Vcc electric potential through the PMOS transistor 116. Thus the static passing-through electric current is prevented from flowing. Such a PMOS transistor may be referred to as a pulling-up PMOS transistor.

However, after the data line 110 is used for reading the High level as described above, the data line 110 may be then used for reading the Low level. In such a case, the PMOS transistor 116 is previously in its ON state. Therefore, reading of the Low level may be delayed.

Further, whether or not such a pulling-up PMOS transistor 116 is provided in the reading circuit, only a single determination electric potential level (a threshold level of the reading circuit 114) is provided for determining whether a supplied level is the High level or Low level. Therefore, it is not possible to optimize this determination level for reading the High level and also for reading the Low level simultaneously.

An example of a current-mirror-type sense amplifier for reading data from a RAM is shown in FIG. 11B. A pair of a bit line signal BL and an inverted bit line signal BLB of a memory cell of a RAM2 are input to gates of NMOS transistors 120 and 122, respectively. PMOS transistors 124, 126 are connected between drains of the NMOS transistors 120, 122 and a Vcc power source terminal, respectively. ('B' added after a reference symbol, for example, 'BLB' for 'BL', indicates that a signal is an inverted signal of an original signal, throughout this specification.) A point at which the MOS transistors 120 and 124 are connected with one another is connected to gates of the two PMOS transistors 124, 126. Sources of the NMOS transistors 120, 122 are connected to the ground terminal GND via a NMOS transistor 128. An output is supplied from a point (output terminal) at which MOS transistors 122 and 126 are connected together. A precharging PMOS transistor 129 is connected between the output terminal and the Vcc terminal. When precharging, the output is thereby at a High level. A control signal SIN1 is input at gates of the MOS transistors 128 and 129.

In this reading circuit, the control signal SIN1 has a High level when a data reading operation is performed. At this time, when the bit line signal BL is used for reading a High level signal, a static passing-through electric current flows through the MOS transistors 124, 120 and 128.

Other examples of current-mirror-type sense amplifiers for reading data from a RAM are shown in FIGS. 12B and 12C. In each circuit, when precharging, an output has a Low level. In the circuit shown in FIG. 12B, a pair of bit line signals BL and BLB are input to NMOS transistors 130, 132, respectively. Drains of PMOS transistors 134, 136 are connected to drains of the NMOS transistors 130, 132, respectively. Sources of the PMOS transistors 134, 136 are connected to a Vcc terminal via a PMOS transistor 138. Gates of the PMOS transistors 134, 136 are connected to a point at which the MOS transistors 130 and 134 are connected to one another. Thus, a current-mirror circuit is formed. A point at which the MOS transistors 132 and 136 are connected with one another is an output terminal Sout3. The output terminal Sout3 is connected to a ground terminal via an NMOS transistor 139. A control signal SIN3 is input to gates of the MOS transistors 139 and 138.

In the circuit shown in FIG. 12C, a pair of bit line signals BL and BLB are input to gates of PMOS transistors 140 and 142. Drains of the PMOS transistors 140 and 142 are connected to a ground terminal GND via NMOS transistors 144 and 146, respectively. Gates of the NMOS transistors 144 and 146 are connected to a point at which the MOS transistors 140 and 144 are connected together. Thus, a current-mirror circuit is formed. Sources of the PMOS transistors 140 and 142 are connected to a Vcc terminal via a PMOS transistor 148. A point at which the MOS transistors 142 and 146 are connected with one another is an output terminal Sout4. The output terminal Sout4 is connected to a ground terminal GND via an NMOS transistor 150. A control signal SIN4 is input to gates of the MOS transistors 150 and 148.

Depending on whether MOS transistors to which bit line signals are input from a memory cell are the N-channel ones (in the case of a sense amplifier SA3 shown in FIG. 12B) or the P-channel ones (in the case of a sense amplifier SA4 shown in FIG. 12C), as shown in FIG. 12D, a variation of a reading time resulting from a power source voltage Vcc variation is different. In the case of the sense amplifier SA3 shown in FIG. 12B, when the power source voltage Vcc is reduced to be approximately 2·Vtn (where Vtn is a threshold voltage of the NMOS transistors), a reading time sharply increases. This is because, in order that an operation point of the sense amplifier SA3 is in a saturation zone of the NMOS transistors, it is necessary that $Vcc \geq 2 \cdot Vtn$. Such a problem does not occur in the case of using the sense amplifier SA4 shown in FIG. 12C. However, even if the power source voltage Vcc is increased, a reading rate is not remarkably improved. Instead, when the power source voltage Vcc is increased, the reading rate is lower in the case of SA4 than in the case of SA3.

Another object of the present invention is to optimize determination electric potential levels for reading a High level and also for reading a Low level from a ROM memory cell.

Further, another object of the present invention is to restrict a static passing-through electric current and thus reduce power consumption.

Further, another object of the present invention is to enable high-speed data reading even when a power source voltage varies.

Other objects and further features of the present invention will become more apparent from the following detailed description when read in conjunction with the accompanying drawings.

SUMMARY OF THE INVENTION

In order to provide a sense amplifier having a low power consuming rate and a high accessing performance, a sense amplifier is proposed which comprises:

state control means for causing a sense amplifier portion to be in an active state and for causing the sense amplifier portion to be in an inactive state;

feedback means for causing the control means to cause the sense amplifier portion to be in the inactive state when a path is formed between a power source and a ground in the sense amplifier portion; and latch means for holding an output of the sense amplifier portion when the path is formed.

In the sense amplifier, it may be that:

the state control means comprises a first transistor acting as a switching device; and the feedback means produces a control signal using an output of the sense amplifier portion and a clock signal obtained from a detection circuit, and supplies the control signal to the first transistor.

Further, in this arrangement, it is also possible that a second transistor for precharging is connected between the first transistor and the power source.

Further, in the sense amplifier, it may be that:

the state control means comprises a transistor acting as a switching device; and the feedback means produces a control signal using an output of the sense amplifier portion and a chip enable signal, and supplies the control signal to the transistor.

In this arrangement, when the sense amplifier portion is in an active state and the sense amplifier outputs a Low-level signal in response to a memory cell in an ON state being selected, the state control means controlled by the feedback means causes the sense amplifier portion to be in the inactive state. Thereby, no static passing-through electric current flows through the sense amplifier portion. Further, because the Low-level signal output from the sense amplifier portion is held by the latch means, it is not necessary to quickly pick up the output of the sense amplifier.

Further, by appropriately causing the sense amplifier portion to be in the inactive state so as to prevent the static passing-through electric current from flowing therethrough, it is possible to effectively reduce power consumption in the sense amplifier. Further, by providing the second transistor for precharging, it is possible to effectively shorten an accessing time.

Further, a reading circuit is proposed which reads an output signal output from a memory cell which is provided at a point of points at which a plurality of word lines cross a plurality of bit lines in a semiconductor memory, the reading circuit comprising:

a pair of sense amplifiers for inputting thereinto the output signal from the memory cell in parallel, the pair of sense amplifiers comprising respective inverters, which inverters have respective logical threshold voltages different from each other; and an output selecting circuit for selecting outputs of the pair of sense amplifiers so that an output of a sense amplifier of the pair of sense amplifiers having a lower logical threshold voltage of the respective logical threshold voltages is selected if a previous output signal output from the memory cell has a Low level, and an output of a sense amplifier of the pair of sense amplifiers having a higher logical threshold voltage of the respective logical threshold voltages is selected if a previous output signal output from the memory cell has a High level.

Thereby, it is possible to optimize Low-level data reading and High-level data reading, respectively.

Further, when the respective inverters comprise CMOS inverters, respectively, it is preferable that:

a PMOS transistor is provided between a power source and respective input terminals of the pair of sense amplifiers; and a gate of the PMOS transistor is connected to an output terminal of one of the pair of sense amplifiers.

Thereby, the High level of the read data is drawn up to the power source level through the PMOS transistor, and thus it is possible to prevent a static passing-through electric current from flowing through the inverter of the sense amplifier.

Further, a reading circuit is proposed which comprises:

a current-mirror-type sense amplifier into which a bit line signal from a RAM memory cell and an inverted signal of the bit line signal are input, and a static passing-through electric current flows when the bit line signal has a predetermined one of a High level and a Low level;

a latch circuit for holding an output signal output from the sense amplifier when it is determined that the bit line signal has the predetermined one of the High level and the Low level; and a sense circuit for causing the sense amplifier to be in an inactive state when it is determined that the bit line signal has the predetermined one of the High level and the Low level.

Thereby, no static passing-through electric current flows through the sense amplifier because the sense circuit causes the sense amplifier to be in the inactive state. Further, because the output signal of the sense amplifier is held by the latch circuit, it is not necessary to quickly pick up the output of the sense amplifier.

Further, a reading circuit is provided which comprises:

a first current-mirror-type sense amplifier in which a bit line signal from a RAM memory cell and an inverted signal of the bit line signal are input to gates of NMOS transistors, respectively;

a second current-mirror-type sense amplifier in which the bit line signal and the inverted signal are input to gates of PMOS transistors, respectively; and an OR circuit for outputting outputs of the first and second current-mirror-type sense amplifiers.

Thereby, the reading circuit can read data from the memory cell at high speed even if the power source voltage varies through a wide range because the OR circuit passes an output signal therethrough when one of the first and second current-mirror-type sense amplifiers outputting the output signal first outputs the output signal.

Further, this reading circuit may further comprise:

a latch circuit for holding an output of the OR circuit when the OR circuit outputs an output signal which results from the bit line signal and the inverted signal being input to the first and second current-mirror-type sense amplifiers, the bit line signal and the inverted signal being those which cause a static passing-through electric current to flow in the first and second current-mirror-type sense amplifiers; and a control signal generating circuit for outputting a control signal, which causes the first and second current-mirror-type sense amplifiers to be in an inactive state, when the OR circuit outputs the output signal which results from the bit line signal and the inverted signal being input to the first and second current-mirror-type sense amplifiers, the bit line signal and the inverted signal being those which cause a static passing-through electric current to flow in the first and second current-mirror-type sense amplifiers.

Thereby, no static passing-through electric current flows through the sense amplifier because the control signal generating circuit causes the sense amplifier to be in the inactive state. Further, because the output signal of the sense amplifier is held by the latch circuit, it is not necessary to quickly pick up the output of the sense amplifier.

BRIEF DESCRIPTION OF THE DRAWINGS

FIG. 3 illustrates an operation of the sense amplifier shown in FIG. 2;

FIG. 4A shows a circuit diagram of a reading circuit in the related art in a mask ROM;

FIG. 4B shows a circuit diagram of an example of an inverter;

FIG. 11B shows a circuit diagram of a current-mirror-type sense amplifier in the RAM reading circuit shown in FIG. 11A;

FIG. 11C illustrates operations of two sense amplifiers in the circuit shown in FIG. 11A;

FIGS. 13B and 13C show circuit diagrams of sense amplifiers in the RAM reading circuit shown in FIG. 13A; and FIG. 13D illustrates operations of two sense amplifiers shown in FIGS. 13B and 13C.

DETAILED DESCRIPTION OF PREFERRED EMBODIMENTS

Figure 1:
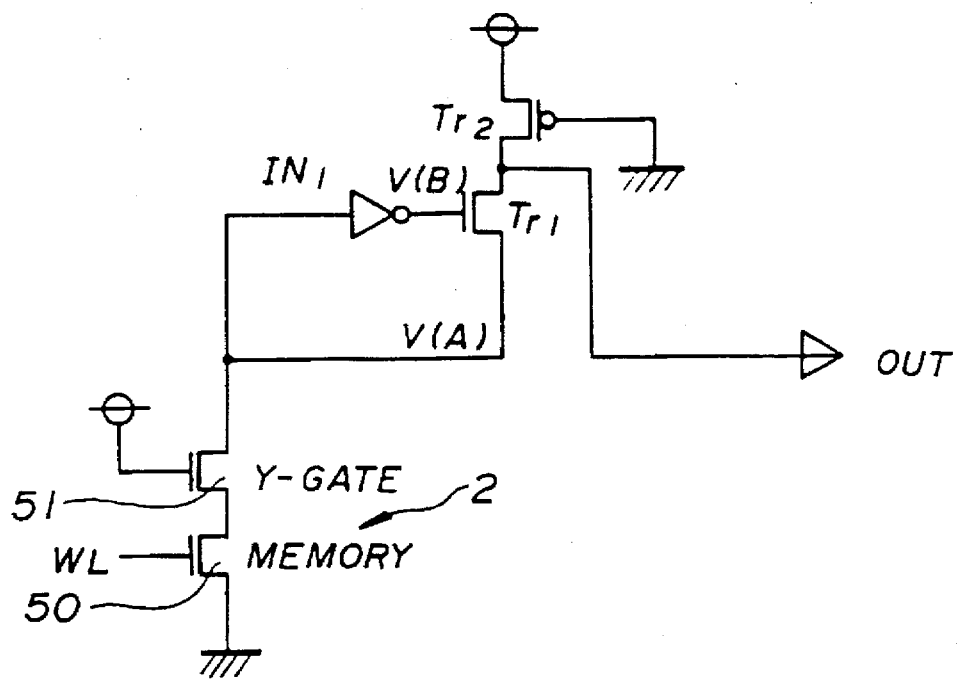
FIG. 1 shows a circuit diagram of a sense amplifier in the related art.
Figure 2:
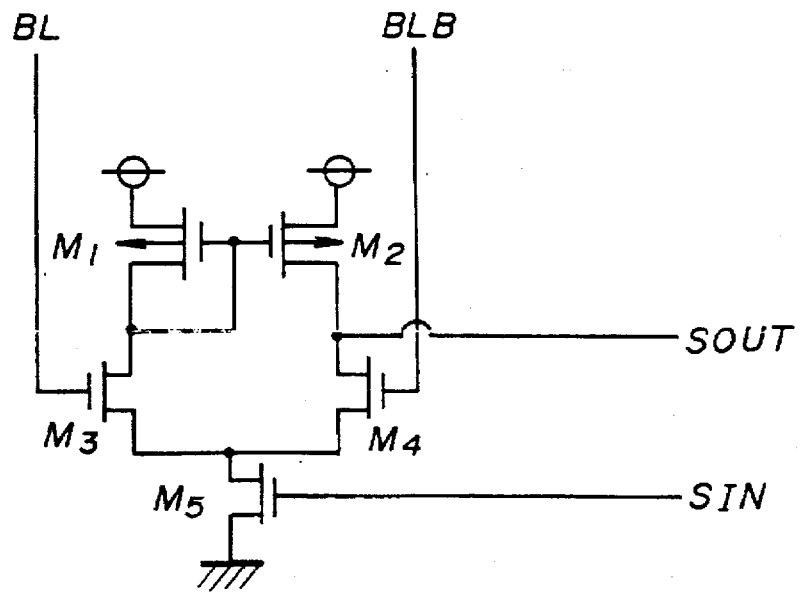
FIG. 2 shows a circuit diagram of a current-mirror-type sense amplifier in the related art.

A first embodiment of the present invention will now be described with reference to accompanying drawings. In the description, for functional components/parts common between a sense amplifier in the first embodiment and the sense amplifier in the related art shown in FIG. 1, common reference numerals are given.

Figure 5:
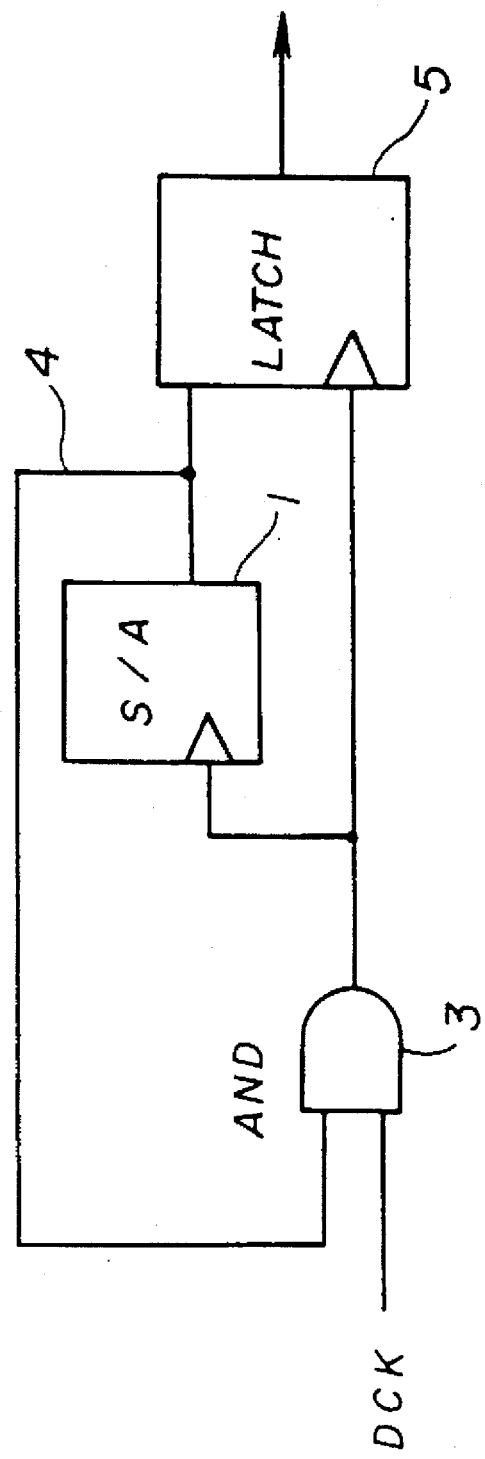
FIG. 5 shows a block diagram of a general arrangement of a sense amplifier in a first embodiment according to the present invention.
Figure 6:
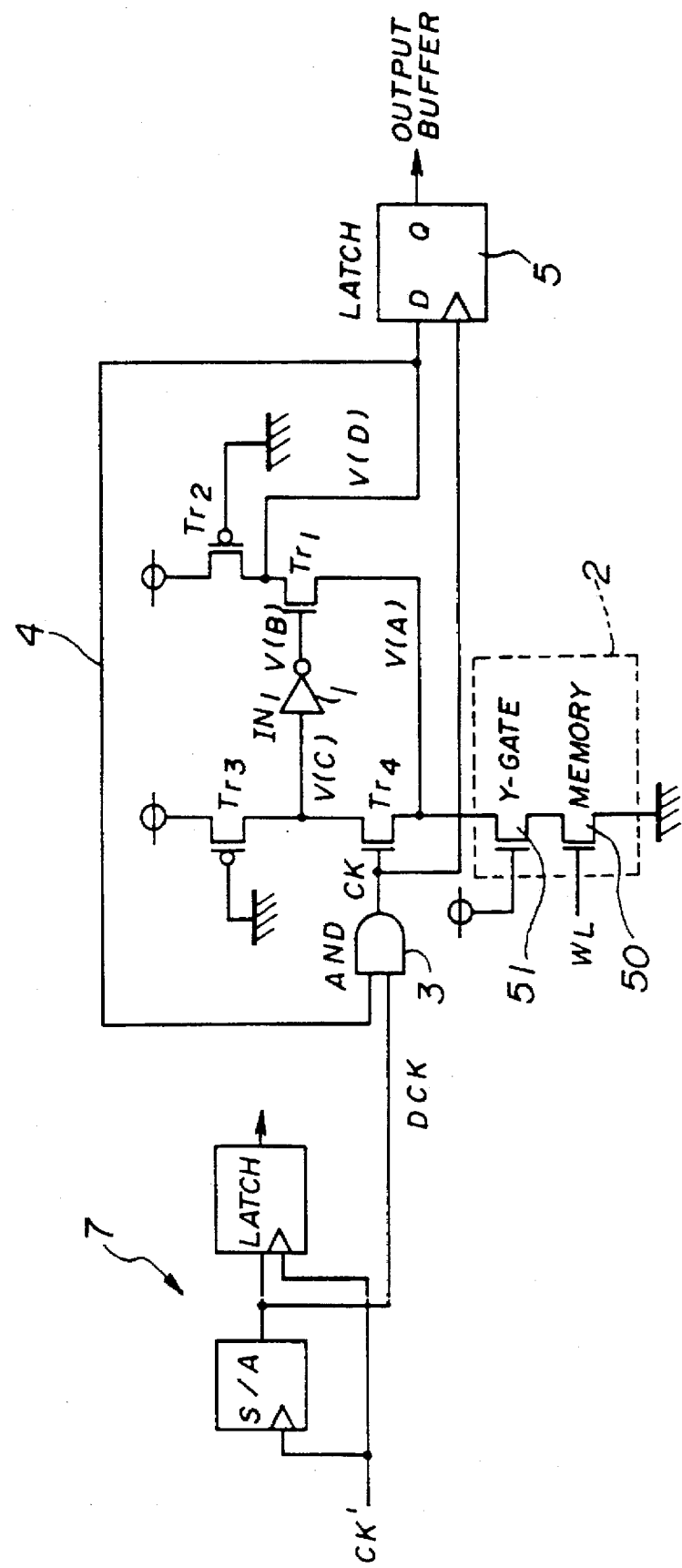
FIG. 6 shows a circuit diagram of a specific arrangement of the sense amplifier shown in FIG. 5.

FIG. 5 shows a block diagram of a general arrangement of the sense amplifier in the first embodiment. FIG. 6 shows a circuit diagram of a specific circuit of the sense amplifier. The circuit shown in FIG. 6 shows an example using an EPROM. The sense amplifier includes a sense amplifier portion 1. The sense amplifier portion 1, similar to the circuit shown in FIG. 1 in the related art, includes a memory cell output portion 2, an inverter $IN_1$, an N-channel transistor $Tr_1$ and a P-channel transistor $Tr_2$ for loading. The memory cell output portion 2 includes a memory cell 50 and a memory selection transistor 51. The inverter $IN_1$ inverts an input signal. An output of the inverter $IN_1$ is input to a gate of the transistor $Tr_1$. A source of the transistor $Tr_1$ is connected to an output terminal of the memory cell output portion 2. The transistor $Tr_2$ is connected to a drain of the transistor $Tr_1$. A point at which the transistors $Tr_1$ and $Tr_2$ are connected with one another is an output terminal OUT of the sense amplifier portion 1.

A drain of an N-channel transistor $Tr_4$ is connected to an input terminal of the inverter $IN_1$, and a source of the transistor $Tr_4$ is connected to the source of the transistor $Tr_1$. The transistor $Tr_4$ acts as activation control means. A clock signal CK is input to a gate of the transistor $Tr_4$. This clock signal CK is output from an AND circuit AND.

This AND circuit AND and a feedback path 4 constitute feedback means 3. A dummy circuit (detection circuit) 7 supplies a dummy clock signal DCK to one input terminal of the AND circuit AND, and an output signal (feedback signal) of the sense amplifier portion 1 from the output terminal OUT is supplied to the other input terminal of the AND circuit AND. Thus, the output signal of the sense amplifier portion 1 from the output terminal OUT is sent to one of the input terminals of the AND circuit AND, as the feedback signal, through the feedback path 4.

The output signal of the sense amplifier portion 1 from the output terminal OUT is supplied to a data input terminal D of a latch circuit 5. The clock signal CK is supplied to the latch circuit 5 as a latch control signal. The latch circuit 5 holds an input signal when receiving a decaying edge of the clock signal CK, and outputs the signal to an output buffer (not shown in the figures). The latch circuit 5 passes an input signal therethrough when the clock signal CK has a High level.

A point at which the transistor $Tr_4$ is connected to the inverter $IN_1$ is connected to a power source via a P-channel transistor $Tr_3$. This transistor $Tr_3$ is provided for precharging, and a gate of the transistor $Tr_3$ is grounded.

Figure 7:
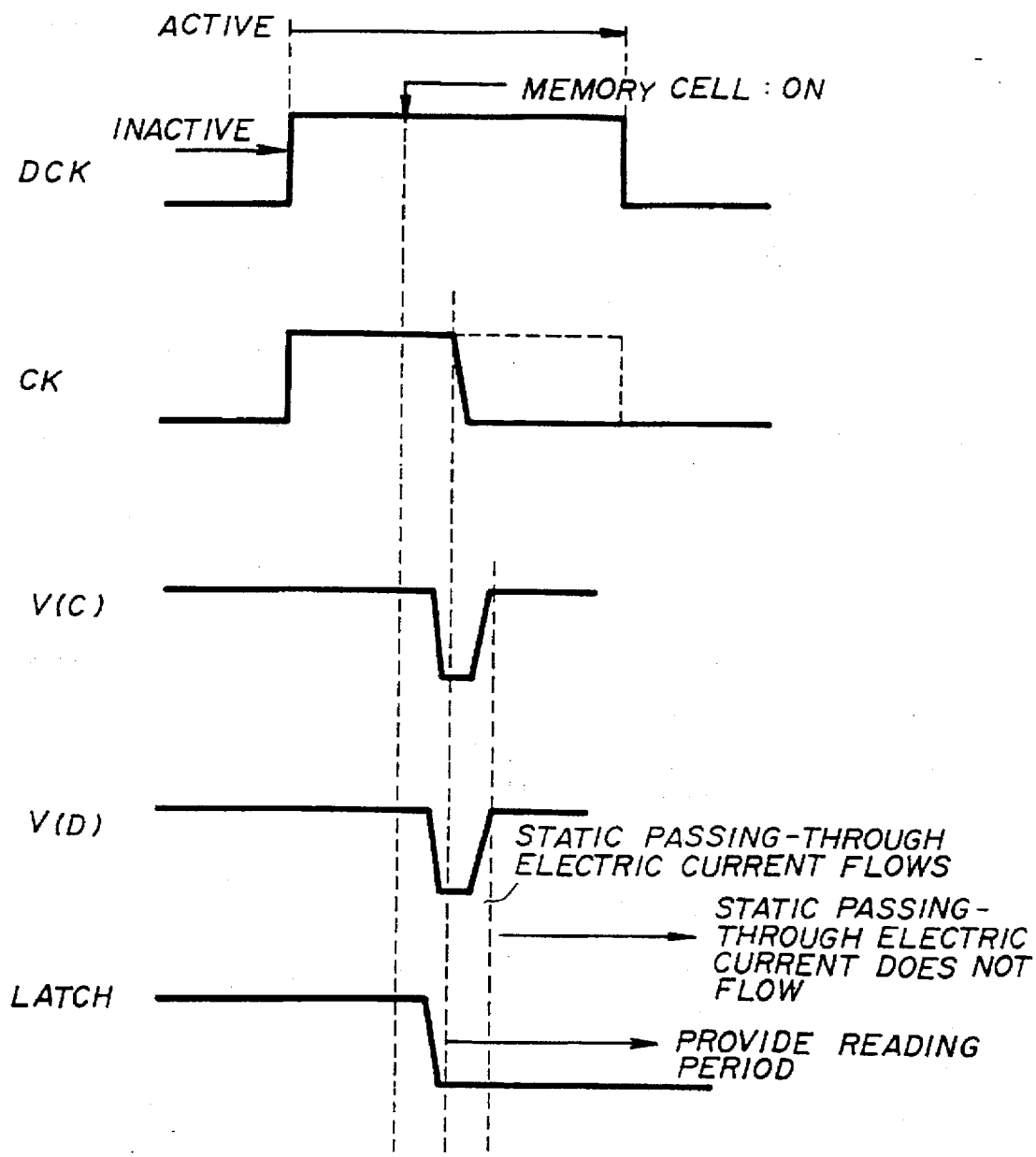
FIG. 7 shows time charts indicating electric potential variations at points in the circuit shown in FIG. 6.

FIG. 7 shows a time chart indicating a variation of an electric potential at each point in the circuit shown in FIG. 6. An operation of the sense amplifier in the first embodiment will now be described.

A case will now be considered in which the memory cell 50 which is in its ON state is selected through the selection transistor 51. This selection is performed by applying a High level to a word line WL connected to the memory cell 50. In this case, the sense amplifier portion 1 is in an inactive (precharging) state, because the dummy clock signal DCK has a Low level and therefore the AND circuit AND outputs the clock signal CK having a Low level. Thereby, the transistor $Tr_4$ is in its OFF state. When the transistor $Tr_4$ is in its OFF state, an electric potential V(C) at the input terminal of the inverter $IN_1$ is at a High level. When V(C) is at the High level, an electric potential V(B) at an output terminal of the inverter $IN_1$ is at a Low level. Further, an electric potential V(A) decays at the source of the transistor $Tr_1$ as a result of discharging through the memory cell 50 which is in its ON state. Because the $Tr_4$ is in the OFF state, V(C) is at the High level and thereby V(B) is at the Low level as mentioned above, the transistor $Tr_1$ is in its OFF state. As a result, the an electric potential V(D) at the output terminal OUT is at a High level. Therefore, one input terminal of the AND circuit AND is at the High level. Further, the High level is input to the data input terminal of the latch circuit 5.

Then, when the sense amplifier portion 1 is in an active state in which the dummy clock signal DCK has a High level, a High level is input to each of the two input terminals of the AND circuit AND. As a result, the AND circuit AND outputs the clock signal CK having a High level. Thereby, the transistor $Tr_4$ is in its ON state. In this condition, each of the electric potentials V(A) and V(C) is at a Low level. In this condition, the electric potential V(B) is at a High level. Thereby, the transistor $Tr_1$ is in its ON state. As a result, the electric potential V(D) decays to the level of the electric potential V(A). As a result, the sense amplifier portion 1 outputs a Low level from the output terminal OUT, and the Low level is input to the data input terminal of the latch circuit 5.

In this condition, each of the transistors $Tr_4$ and $Tr_1$ is in its ON state as described above. In this condition, a static passing-through electric current flows therethrough. However, when the voltage V(D) is at the Low level, the clock signal CK which is output by the AND circuit AND has a Low level. Thereby, the active state of the sense amplifier portion 1 is released and the sense amplifier portion 1 enters the inactive state. Thereby, as described above, each of the transistors $Tr_4$ and $Tr_1$ is in its OFF state and therefore no static passing-through electric current flows therethrough. Further, at a time at which the Low level of the clock signal CK is input to the latch circuit 5, the latch circuit 5 holds the Low level of the electric potential V(D). Thereby, when the active state of the sense amplifier portion 1 is released as mentioned above, the output signal of the sense amplifier portion 1 from the output terminal OUT is held to be the Low level.

FIG. 7 shows a case where first the sense amplifier portion 1 comes to be in the active state (indicated by the letters 'ACTIVE' in the figure) and then the memory cell 50 in the ON state is selected (indicated by the letters 'MEMORY CELL ON' in the figure). In this case, when the sense amplifier portion is in the active state, the transistor $Tr_4$ is in the ON state because DCK is at the High level and thereby CK is at the High level as shown in FIG. 7. Further, the transistor $Tr_1$ is in the OFF state as will be described later in description of a case where the memory cell in the OFF state is selected and then the sense amplifier portion comes to be in the active state. Then, when the memory cell in the ON state is selected, the transistors 50 and 51 in the memory cell output portion 2. As a result, V(C) comes to have the Low level as shown in FIG. 7 and thereby V(B) comes to have the High level. As a result, the transistor $Tr_1$ comes to be in the ON state and thereby V(D) comes to have the Low level as shown in FIG. 7.

A case where the memory cell 50 in its OFF state is selected through the selection transistor 51 will now be considered. In this case, when the sense amplifier portion 1 is in the inactive state, the dummy clock signal DCK has the Low level and thereby the AND circuit AND outputs the Low level. As a result, similar to the case where the memory cell 50 in the ON state is selected and the sense amplifier portion 1 is in the inactive state, the electric potential V(D) is at the High level. Only if the memory cell 50 in the OFF state is previously selected, the electric potential V(A) is at an intermediate potential. Then, when the sense amplifier portion 1 comes to be in the active state as a result of the dummy clock signal having the High level, the transistor $Tr_4$ comes to be its ON state. As a result, the electric potential V(C) decays to the level of the electric potential V(A) in a moment. However, the transistor $Tr_3$ for precharging and the transistor $Tr_2$ cause the electric potential V(C) to rise rapidly. Then, when a state in which $V(B)=V(A)+V_{TH}$ occurs, the transistor $Tr_1$ comes to be in the OFF state, and thereby the electric potential V(D) comes to be at the High level. In this condition, a static passing-through electric current hardly flows because the selected memory cell is in the OFF state and thereby a passing-through path between the power source and the ground is not formed.

As described above, when the sense amplifier portion 1 is in the inactive state, the output electric potential V(D) is fixed to be at the High level and no static passing-through electric current flows. Further, when the memory cell in the OFF state is selected and the sense amplifier portion 1 is in the active state, the transistor $Tr_3$ for precharging causes the electric potential V(A) to rise rapidly. As a result, it is possible to shorten an access time for substantially accessing the memory cell.

In this embodiment, when the memory cell in the ON state is selected, the sense amplifier, which is in the active state due to the High level of the dummy clock signal DCK, comes to be in the inactive state due to the Low level of the output signal V(D). Thus, a state of the sense amplifier portion 1 is controlled between the active and inactive states only by the dummy clock signal DCK and also the output level V(D). However, it is also possible that a state of the sense amplifier portion 1 is controlled between the active and inactive states only by the dummy clock signal DCK. However, it should be that, during a period in which the dummy clock signal DCK is at the High level, any actual commercial product of the sense amplifier, including possible variation in its performance throughout many products thereof in general, can read information of the memory cell. For this purpose, some margin is provided in the period in which the dummy clock signal DCK has the High level, and thereby the period is relatively long. As a result, a period during which the static passing-through electric current flows is relatively long.

In the sense amplifier in the first embodiment, as described above, in a case where information of the memory cell in the OFF state is read, the dummy clock signal DCK passes through the AND circuit AND, and thereby is used as the clock signal CK. However, in a case where information of the memory cell in the ON state is read, when the output signal from the output terminal OUT comes to be the Low level, the AND circuit AND causes the Low level to be input to the transistor $Tr_4$. Thereby, the sense amplifier portion 1 comes to be in the inactive state. Thus, a period in which the sense amplifier portion is in the active state can be limited to the minimum one for a particular sense amplifier. As a result, it is possible to limit a static passing-through electric current to be the minimum one.

A second embodiment of the present invention will now be described.

Figure 8:
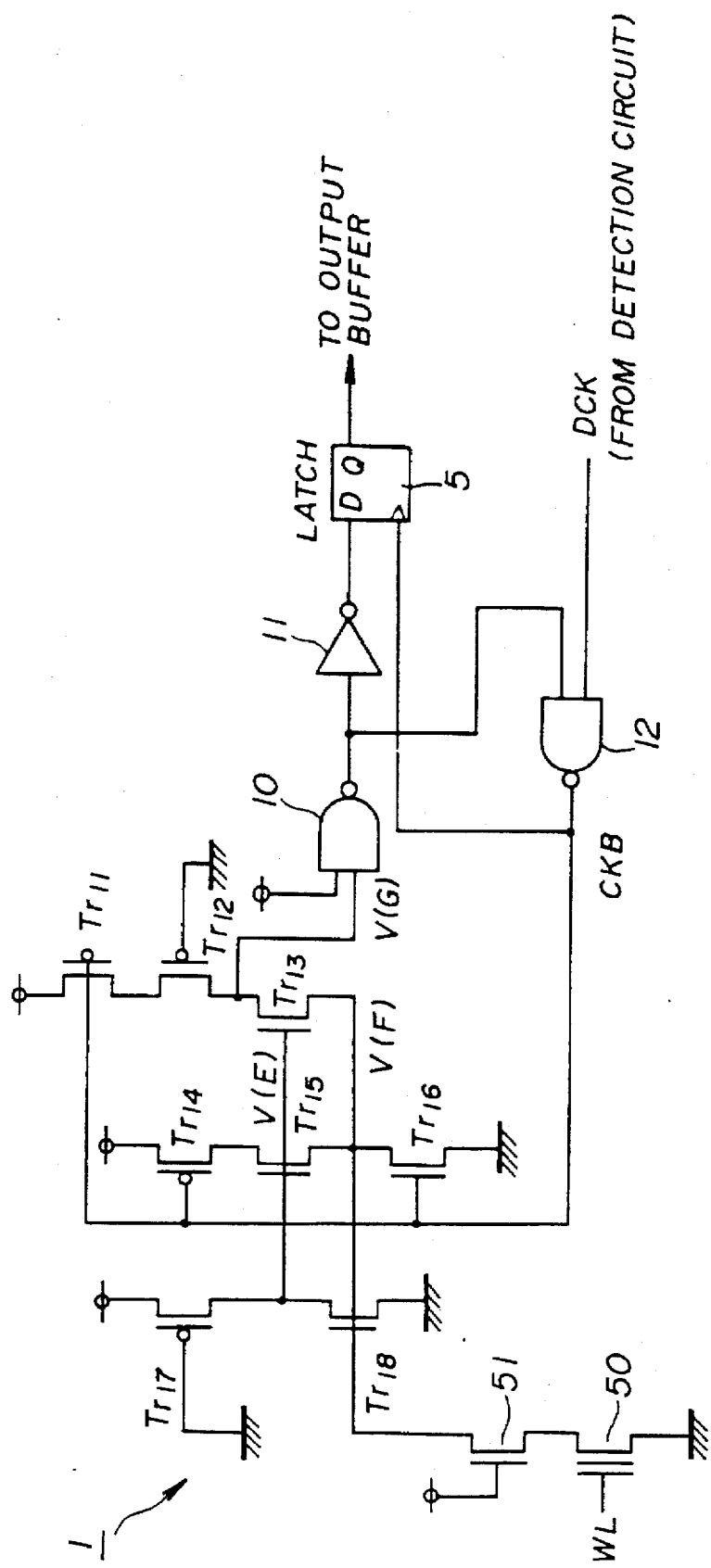
FIG. 8 shows a circuit diagram of a sense amplifier in a second embodiment of the present invention.

FIG. 8 shows a circuit diagram of a sense amplifier in the second embodiment of the present invention. In this circuit, no transistor for precharging such as that provided in the circuit in the above-described first embodiment is provided. Further, in the circuit of the second embodiment, P-channel transistors $Tr_{11}$ and $Tr_{14}$ perform a function similar to that of the transistor $Tr_4$ in the circuit in the first embodiment. In a sense amplifier portion 1 in the circuit shown in FIG. 8, when a memory cell in its OFF state is selected, a static passing-through electric current tends to flow. In the second embodiment, reduction of the static passing-through electric current is achieved.

The sense amplifier portion 1 includes a memory cell output portion 2 which includes a memory cell 50, a memory selection transistor 51 and an N-channel transistor $Tr_{16}$ for predischarging. The sense amplifier portion 1 further includes the P-channel transistor $Tr_{11}$, a P-channel transistor $Tr_{12}$ and an N-channel transistor $Tr_{13}$ arranged sequentially between a power source and the above-mentioned transistor $Tr_{16}$. The sense amplifier portion 1 further includes the P-channel transistor $Tr_{14}$ and an N-channel transistor $Tr_{15}$ similarly arranged sequentially between the power source and the transistor $Tr_{16}$. The sense amplifier portion 1 further includes a P-channel transistor $Tr_{17}$ and an N-channel transistor $Tr_{18}$ sequentially arranged between the power source and the ground. A point at which the transistors $Tr_{12}$ and $Tr_{13}$ are connected together is an output point of the sense amplifier portion 1.

An output signal of the sense amplifier portion 1 is input to one input terminal of a NAND circuit 10 having two input terminals. A High level is input to the other input terminal of the NAND circuit 10. An output signal of the NAND circuit is input to a data input terminal of a latch circuit 5 via an inverter 11. Further, the output signal of the NAND circuit 10 is also input to one input terminal of another NAND circuit 12 having two input terminals. Further, a dummy clock signal DCK is supplied from a detection circuit (not shown in the figure) to the other input terminal of the NAND circuit 12. An output signal CKB of the NAND circuit 12 is input to a latch control terminal of the latch circuit 5, and also input to a gate of each of the transistors $Tr_{11}$, $Tr_{14}$ and $Tr_{16}$.

Further, a Low level is input to a gate of each of the transistors $Tr_{12}$ and $Tr_{17}$. An electric potential at a point at which the transistors $Tr_{17}$ and $Tr_{18}$ are connected with one another is input to a gate of each of the transistors $Tr_{15}$ and $Tr_{13}$. Further, an electric potential at a point at which the transistors $Tr_{13}$, $Tr_{15}$ and $Tr_{16}$ are connected with one another is input to a gate of the transistor $Tr_{18}$.

In the above-described circuit, when the dummy clock signal DCK from the detection circuit not shown in the figure is at a Low level, a clock signal CKB is at a High level and the sense amplifier portion 1 is in its inactive state. In this state, the transistor $Tr_{16}$ is in its ON state, and each of the transistors $Tr_{14}$, $Tr_{11}$ and $Tr_{18}$ is in its OFF state. Thereby, no static passing-through electric current flows in the sense amplifier portion 1. Further, an electric potential V(G) is maintained to be a Low level because each of the transistors $Tr_{16}$ and $Tr_{13}$ is in its ON state. In the condition in which the electric potential V(G) is maintained to be the Low level as mentioned above and thereby the NAND circuit 10 outputs a High level, a level of the signal CKB output by the NAND circuit 12 is determined by a level of the dummy clock signal DCK output by the detection circuit.

When the dummy clock signal DCK from the detection circuit is at a High level, the clock signal CKB has a Low level and the sense amplifier portion 1 is in an active state. In this state, the transistor $Tr_{16}$ is in its OFF state, and each of the transistors $Tr_{14}$, $Tr_{11}$ is in its ON state.

In this active state, when the memory cell 50 is in its ON state, the transistor $Tr_{18}$ is in its OFF state. Thereby, the transistor $Tr_{13}$ is in the ON state. As a result, the electric potential V(G) continues to be at the Low level. Also in this case, a level of the clock signal CKB which controls whether the sense amplifier portion 1 is in the active state or in the inactive state is determined only by a level of the dummy clock signal DCK.

When the memory cell 50 is in its OFF state in the condition in which the sense amplifier portion 1 is in the active state, charging is performed at an electric potential V(F). Then, when a state in which $V(E)=V(F)+V_{TH}$ occurs, the transistor $Tr_{13}$ comes to be in its OFF state. As a result, the electric potential V(D) comes to be at a High level. Further, in this condition, the transistor $Tr_{18}$ comes to be in its ON state. Thereby, a static passing-through electric current flows through the transistors $Tr_{17}$ and $Tr_{18}$.

However, the electric potential V(G) is at the High level as mentioned above. Thereby, the NAND circuit 10 outputs a Low level which is input to one input terminal of the NAND circuit 12. As a result, the NAND circuit 12 outputs the clock signal CKB having a High level even if the dummy clock signal DCK does not decay to a Low level. Thereby, the sense amplifier portion 1 comes to be in the inactive state. In this case, the latch circuit 5 holds a level of the electric potential V(G) due to the clock signal CKB when the sense amplifier portion 1 is in the active state, and outputs the held level to an output buffer. Thus, it is possible to shorten a period, in which the sense amplifier portion 1 is in the active state, to the minimum possible period for reading information of the memory cell, that is, for enabling an output signal, which has a level relevant to a current state of the memory cell, to be positively supplied to the output buffer. Thereby, it is possible to effectively restrict the static passing-through electric current.

A third embodiment of the present invention will now be described.

Figure 9A:
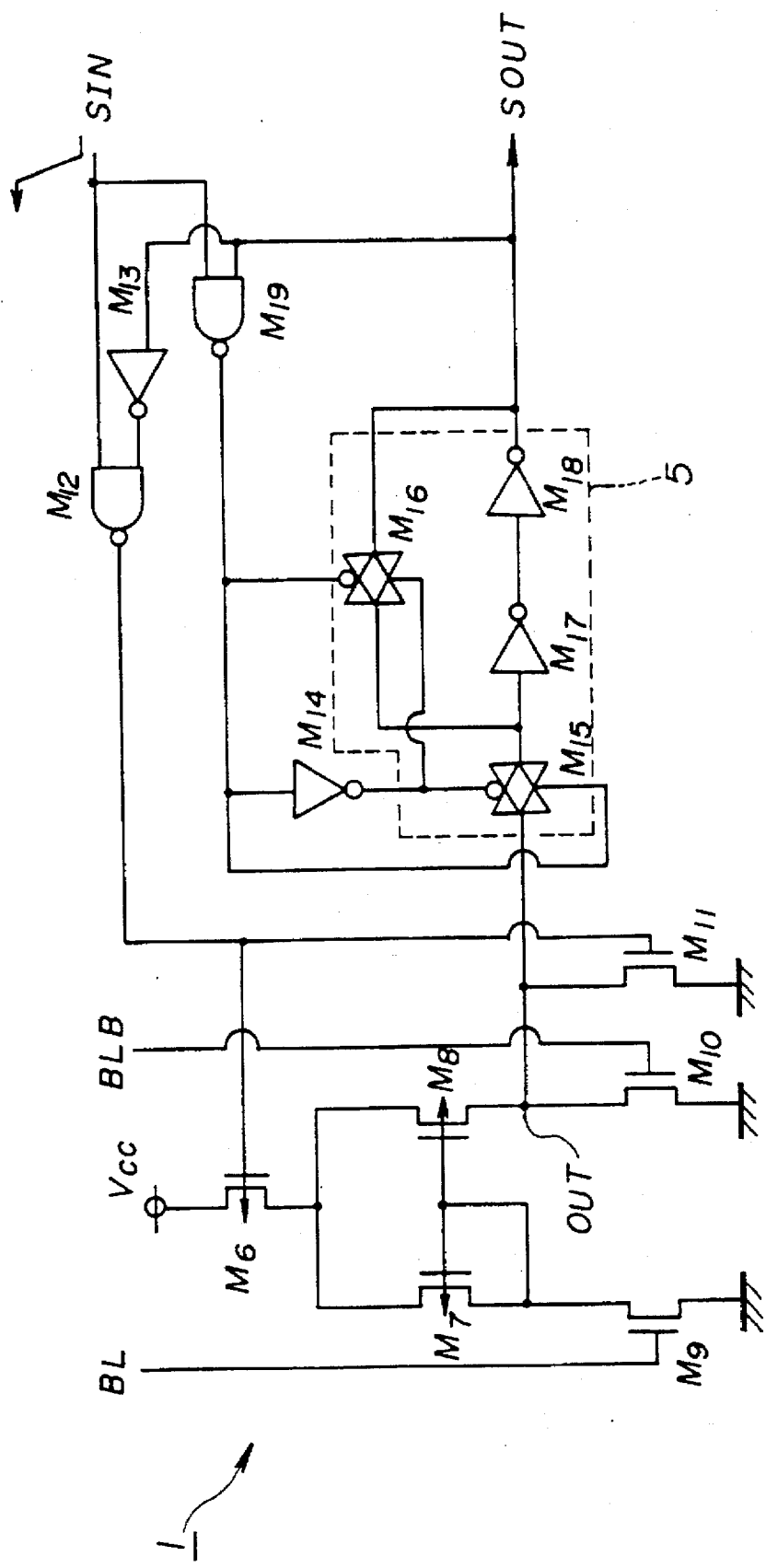
FIGS. 9A and 9B show circuit diagrams of a sense amplifier in a third embodiment of the present invention.

FIG. 9A shows a circuit diagram of a current-mirror sense amplifier in the third embodiment of the present invention. In a sense amplifier portion 1, lines BL and BLB receive mutual complementary output signals which are read out from a memory cell not shown in the figure. In the sense amplifier portion 1, gates of N-channel transistors $M_9$ and $M_{10}$ are connected to the lines BL and BLB, respectively. Further, a source of each of the transistors $M_9$ and $M_{10}$ is grounded. A drain of the transistor $M_9$ is connected to a gate and to a drain of a P-channel transistor $M_7$. A drain of the transistor $M_{10}$ is connected to a drain of a P-channel transistor $M_8$. Each of the transistors $M_7$ and $M_8$ is connected to a power source via a P-channel transistor $M_6$ which acts as activation control means. In the above-described sense amplifier portion 1, a point at which the transistors $M_{10}$ and $M_8$ are connected with one another is an output terminal OUT.

A feedback signal is input to a gate of the transistor $M_6$ and to a gate of the transistor $M_{11}$. A signal SIN (for example, a write enable signal) is input to one input terminal of a NAND circuit $M_{12}$ having two input terminals. A signal is obtained as a result of inverting an output signal from a latch circuit 5 through an inverter $M_{13}$. The thus-obtained signal is input to the other input terminal of the NAND circuit $M_{12}$. The NAND circuit $M_{12}$ thus generates the above-mentioned feedback signal. The above-mentioned latch circuit 5 includes transmission gates $M_{15}$, $M_{16}$, and inverters $M_{17}$, $M_{18}$. An output signal of the sense amplifier portion 1 from the output terminal OUT is input to the latch circuit 5.

Figure 9B:
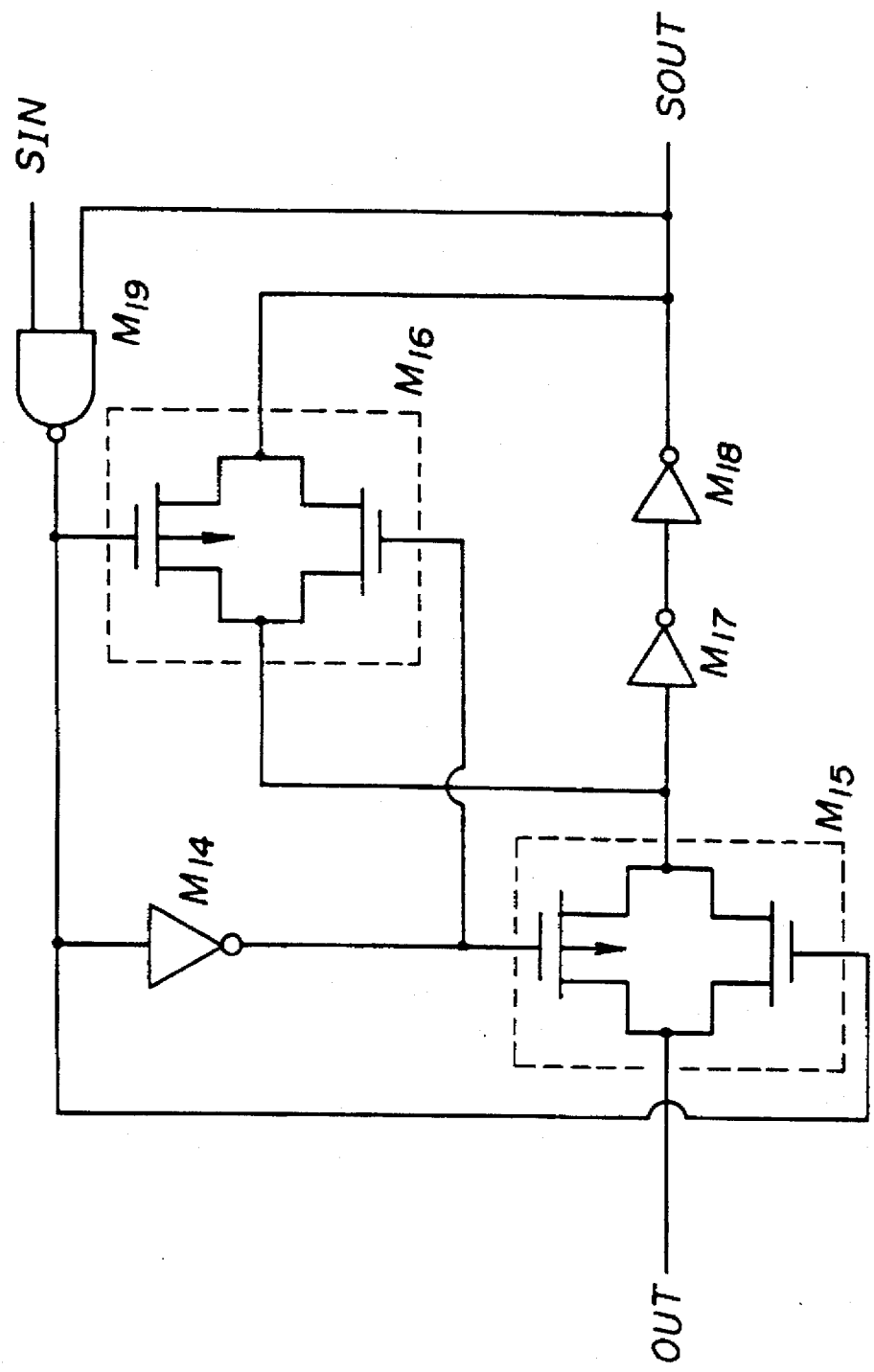

FIG. 9B shows a circuit diagram of part of the circuit shown in FIG. 9A. With reference to FIG. 9B, an operation of the latch circuit 5 will now be described. The latch circuit 5 allows a signal supplied via the terminal OUT to pass through the transmission gate $M_{15}$ when a signal SOUT has a Low level. SOUT has the Low level as mentioned above when precharging, and this results from previously determining sizes of transistors during a design stage of the sense amplifier. When a High-level signal is input to the terminal OUT, the signal SOUT has a High level via the transmission gate $M_{15}$, and inverters $M_{17}$, $M_{18}$. Thereby, a NAND circuit $M_{19}$ outputs a Low-level signal in a condition where the signal SIN has a High level. Thereby, a P-channel transistor of the transmission gate $M_{16}$ is in its ON state. Further, the Low level output of the NAND circuit $M_{19}$ is inverted to be a High-level signal via an inverter $M_{14}$ and supplied to an N-channel transistor of the same transmission gate $M_{16}$. Thereby, this N-channel transistor is also in its ON state. Thus, through the transmission gate $M_{16}$, an output of the inverter $M_{18}$ is short-circuited with an input of the inverter $M_{17}$. In reverse, a P-channel transistor of the transmission gate $M_{15}$ is in its OFF state by the High level signal supplied via the inverter $M_{14}$ and an N-channel transistor of the same transmission gate $M_{15}$ is also in its OFF state by the Low-level signal directly supplied by the NAND circuit $M_{19}$. As a result, the transmission gate $M_{15}$ prevents a signal supplied via the terminal OUT from passing therethrough. Thus, the output signal SOUT is held in the latch circuit 5 through the transmission gate $M_{16}$. The signal input to the inverter $M_{17}$ passes through the inverters $M_{17}$ and $M_{18}$, and thereby a signal advantageously having a level equal to the power source level Vcc is obtained at the output of the inverter $M_{18}$. This signal passes through the inverter $M_{13}$ and NAND circuit $M_{12}$, and thus positively causes the transistor $M_6$ to be in its OFF state. Thereby, no static passing-through electric current flows in the sense amplifier.

Other than this, each of the transmission gates used in the embodiments described in the specification may have the same circuit as that of the transmission gate $M_{15}$, $M_{16}$ shown in FIG. 9B.

The above-mentioned signal SIN and the signal SOUT are input to two input terminals of the NAND circuit $M_{19}$, respectively. The NAND circuit $M_{19}$ outputs a latch control signal to the latch circuit 5. The above-mentioned transistor $M_{11}$ is connected between the output terminal OUT and the ground. The above-mentioned feedback signal is input to a gate of the transistor $M_{11}$. In the above-described circuit, when the transistor $M_6$ is in its ON state, the sense amplifier portion 1 outputs, from the output terminal OUT to the latch circuit 5, an output signal having a level relevant to levels at the lines BL and BLB which are relevant to a current state of the above-mentioned memory cell. When the transistor $M_6$ is in its OFF state, the sense amplifier portion 1 outputs a Low level from the output terminal OUT to the latch circuit 5.

In the circuit, by causing the NAND circuit $M_{12}$ to output a Low level to the gate of the transistor $M_6$, the transistor $M_6$ is in the ON state and thereby the sense amplifier portion 1 is in an active state in which information of the memory cell is read out. The NAND circuit $M_{12}$ outputs the Low level when the latch circuit 5 outputs a Low level and also the signal SIN has a High level.

A case where data "1" stored in the memory cell is read out will now be described. In this case, a High level appears on the line BL and a Low level appears on the line BLB which has a complementary relationship with the line BL. When the transistor $M_6$ is in the ON state, signals of these levels on the lines BL and BLB are input to the transistors $M_9$ and $M_{10}$, respectively. Thereby, the transistor $M_9$ is in its ON state, and the transistor $M_{10}$ is in its OFF state. Further, each of the transistors $M_7$ and $M_8$ is in its ON state. As a result, a level of the output signal of the sense amplifier portion 1 from the output terminal OUT changes from a Low level to a High level. Further, a passing-through path between the power source Vcc and the ground is formed through the transistors $M_6$, $M_7$ and $M_9$. Thereby, a static passing-through electric current flows therethrough.

However, when the level of the output signal of the sense amplifier portion 1 changes from the Low level to the High level as mentioned above, the latch circuit 5 receiving this output signal thereby outputs the signal SOUT of a High level. This signal SOUT of the High level is supplied to the inverter $M_{13}$ and to the NAND circuit $M_{19}$. When the High level is input to the inverter $M_{13}$, a Low level is input to the NAND circuit $M_{12}$ and thereby the NAND circuit $M_{12}$ outputs a High level to the gate of the transistor $M_6$. As a result, the transistor $M_6$ comes to be in the OFF state. As a result, the above-mentioned passing-through path is not formed, and thereby no static passing-through electric current flows in the sense amplifier portion 1. Further, when the High level is input to the NAND circuit $M_{19}$ as mentioned above, in the condition in which the signal SIN has the High level, a level of an output signal of the NAND circuit $M_{19}$ decays to a Low level. Thereby, the Low-level signal is input to the latch circuit 5 and thereby the transmission gate $M_{15}$ is in its OFF state and the transmission gate $M_{16}$ is in its ON state. Thus, the latch circuit 5 continues to outputs the High level although the sense amplifier 1 has been in an inactive state when the transistor $M_6$ has been in the OFF state as mentioned above.

Thus, although the transistor $M_6$ is in the OFF state and thus the sense amplifier portion 1 is in an inactive state, the latch circuit 5 continues to outputs the High level which is relevant to the current data "1" of the memory cell.

Thus, also in this embodiment, it is possible to shorten a period, in which the sense amplifier portion 1 is in the active state (in which the transistor $M_6$ is in the ON state), to the minimum possible period for reading information of the memory cell, that is, for enabling an output signal, which has a level relevant to current data of the memory cell, to be positively supplied as the signal SOUT. Thereby, it is possible to effectively restrict the static passing-through electric current.

As described above, according to the present invention, it is possible to effectively reduce power consumption in the sense amplifier.

Figure 10A:
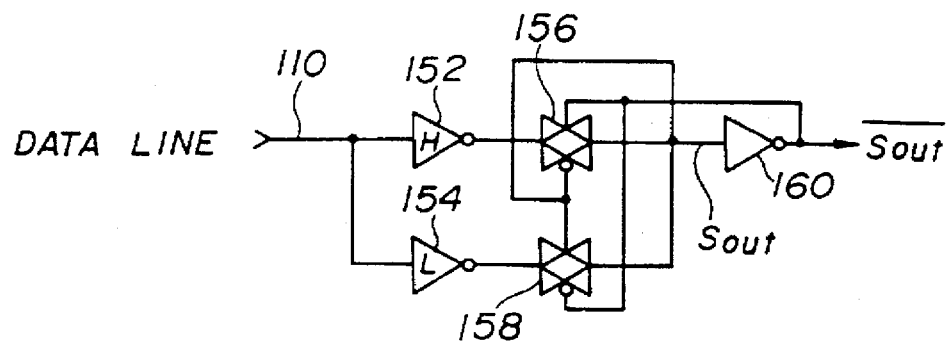
FIGS. 10A, 10B and 10C show a circuit diagram of a ROM reading circuit in a fourth embodiment of the present invention, a time chart illustrating an operation of the circuit shown in FIG. 10A, and a circuit diagram of a ROM reading circuit in a fifth embodiment of the present invention, respectively.

A forth embodiment of the present invention will now be described. FIG. 10A shows a ROM reading circuit in the fourth embodiment of the present invention. In this circuit, High-level reading and Low-level reading are optimized.

The circuit shown in FIG. 10A includes a pair of sense amplifiers 152 and 154. A logical threshold voltage set in the sense amplifier 152 is different from a logical threshold voltage set in the sense amplifier 154. An output signal output from a memory cell (not shown in the figure) is input to each of the sense amplifiers 152 and 154, in parallel, via a data line 110. The logical threshold voltage of the sense amplifier 152 is higher than the logical threshold voltage of the sense amplifier 154. Transmission gates 156 and 158, which cooperatively perform a selecting function, are connected to output terminals of the sense amplifiers 152 and 154, respectively. An output signal Sout output from each of the transmission gates 156 and 158 is input to an inverter 160 which then inverts the signal Sout. The inverted signal is an output signal of the ROM reading circuit. Output electric potentials output from the transmission gates 156 and 158 are applied to an inverting gate terminal of the transmission gate 156 and a non-inverting gate terminal of the transmission gate 158, respectively. An output electric potential output from the inverter 160 is applied to each of a non-inverting gate terminal of the transmission gate 156 and an inverting gate terminal of the transmission gate 158.

In the above-described circuit, when an output level of the sense amplifier 152 is a High level and also an output level of the sense amplifier 154 is a High level, the transmission gate 158 is in its ON state and the transmission gate 156 is in its OFF state. When an output level of the sense amplifier 152 is a Low level and also an output level of the sense amplifier 154 is a Low level, the transmission gate 158 is in its OFF state and the transmission gate 156 is in its ON state.

Figure 10B:
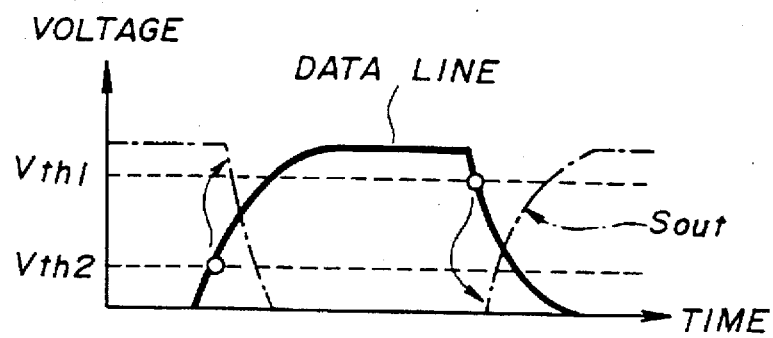

An operation of the ROM reading circuit shown in FIG. 10A will now be described with reference to FIG. 10B. The logical threshold voltage of the sense amplifier 152 is Vth1 and the logical threshold voltage of the sense amplifier 154 is Vth2, where Vth1>Vth2. When a signal level on the data line 110 changes from a Low level to a High level, an output level of the sense amplifier 154 having the lower logical threshold voltage is inverted first and then an output level of the other sense amplifier 152 is inverted. When a signal level on the data line 110 changes from a High level to a Low level, an output level of the sense amplifier 152 having the higher logical threshold voltage is inverted first and then an output level of the other sense amplifier 154 is inverted.

The selecting function of the transmission gates 156 and 158 will now be described. When a Low level appears on the data line 110, a High level is output from each of the sense amplifiers 152 and 154. Thereby, the transmission gate 158 is in the ON state and the transmission gate 156 is in the OFF state as mentioned above. When a High level appears on the data line 110, a Low level is output from each of the sense amplifiers 152 and 154. Thereby, the transmission gate 158 is in the OFF state and the transmission gate 156 is in the ON state as mentioned above.

When a level on the data line 110 will change from the Low level to the High level, the transmission gate 158 is in the ON state and the transmission gate 156 is in the OFF state. Then, the level on the data line rises and an output level of the sense amplifier 154 having the lower threshold voltage Vth2 first changes from a High level to a Low level, while an output level of the other sense amplifier 152 continues to output a High level. At this time, the transmission gate 158 is in the ON state and thereby the Low level output from the sense amplifier 154 passes through the transmission gate 158, while the High level output from the other sense amplifier 152 does not pass through the transmission gate 156.

Then, when a level on the data line 110 will change from the High level to the Low level, the transmission gate 158 is in the OFF state and the transmission gate 156 is in the ON state. Then, the level on the data line decays and an output level of the sense amplifier 152 having the higher threshold voltage Vth1 first changes from a Low level to a High level, while an output level of the other sense amplifier 154 continues to output a Low level. At this time, the transmission gate 156 is in the ON state and thereby the High level output from the sense amplifier 152 passes through the transmission gate 156, while the Low level output from the other sense amplifier 154 does not pass through the transmission gate 158.

Thus, by providing the higher and lower logical threshold voltages Vth1 and Vth2 of the two sense amplifiers 152 and 154, respectively, a level change on the data line 110 rapidly results in a level change of the signal Sout and the output signal output from the inverter 160, in comparison to a case where only a single logical threshold voltage is provided. Further, the higher and lower logical threshold voltages Vth1 and Vth2 can be optimized individually for reading information of a level change from the Low level to the High level and for reading information of a level change from the High level to the Low level. Thereby, it is possible to effectively shorten a time for reading a level change on the data line 110. As a result, it is possible to effectively shorten a time for accessing the memory cell in the ROM reading circuit.

A fifth embodiment of the present invention will now be described with reference to FIG. 10C. A ROM reading circuit shown in FIG. 10C in the fifth embodiment of the present invention is similar to the ROM reading circuit in the fourth embodiment described above with reference to FIGS. 10A and 10B. Differences between the circuit in the fifth embodiment shown in FIG. 10A and the circuit in the fourth embodiment shown in FIG. 10C will now be described. In order to prevent a static passing-through electric current flowing through the sense amplifier 152 and through the sense amplifier 154 in the circuit shown in FIG. 10A, a PMOS transistor 162 is provided for pulling up an input electric potential of each of the sense amplifiers 152 and 154 when a High level is input to each of the sense amplifiers 152 and 154. This pulling-up transistor 162 is connected between a power source Vcc and an input terminal of each of the sense amplifiers 152 and 154. A gate of the transistor 162 is connected to an output terminal of the sense amplifier 152. Instead of connecting the gate of the transistor 162 to the output terminal of the sense amplifier 152, it is also possible to connect the gate of the transistor 162 to an output terminal of the other sense amplifier 154.

Each of the sense amplifiers 152 and 154 has a circuit as shown in FIG. 4B, for example. The pulling-up transistor 162 raises an input level of each sense amplifier when a High level is input. Thereby, the input level is a sufficiently high and only the NMOS transistor in the circuit shown in FIG. 4B is in the ON state. Thus, a static passing-through electric current can be prevented from flowing through the sense amplifiers.

Further, two stages of inverters 164 and 166 are connected in series to an output terminal of the inverter 160.

Figure 10C:
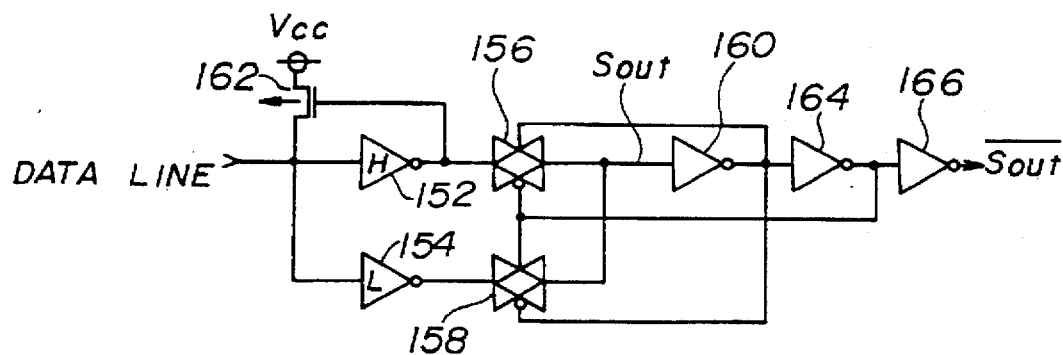

In each of the ROM reading circuits shown in FIGS. 10A and 10C, when a Low level is read from the memory cell via the data line after a High level is read, an output of the ROM reading circuit is rapidly determined by the higher logical threshold voltage Vth1 of the sense amplifier 152. Therefore, in comparison to the reading circuit 114 in the related art shown in FIG. 4A, a memory-cell reading operation can be prevented from being delayed.

A sixth embodiment of the present invention will now be described.

Figure 11A:
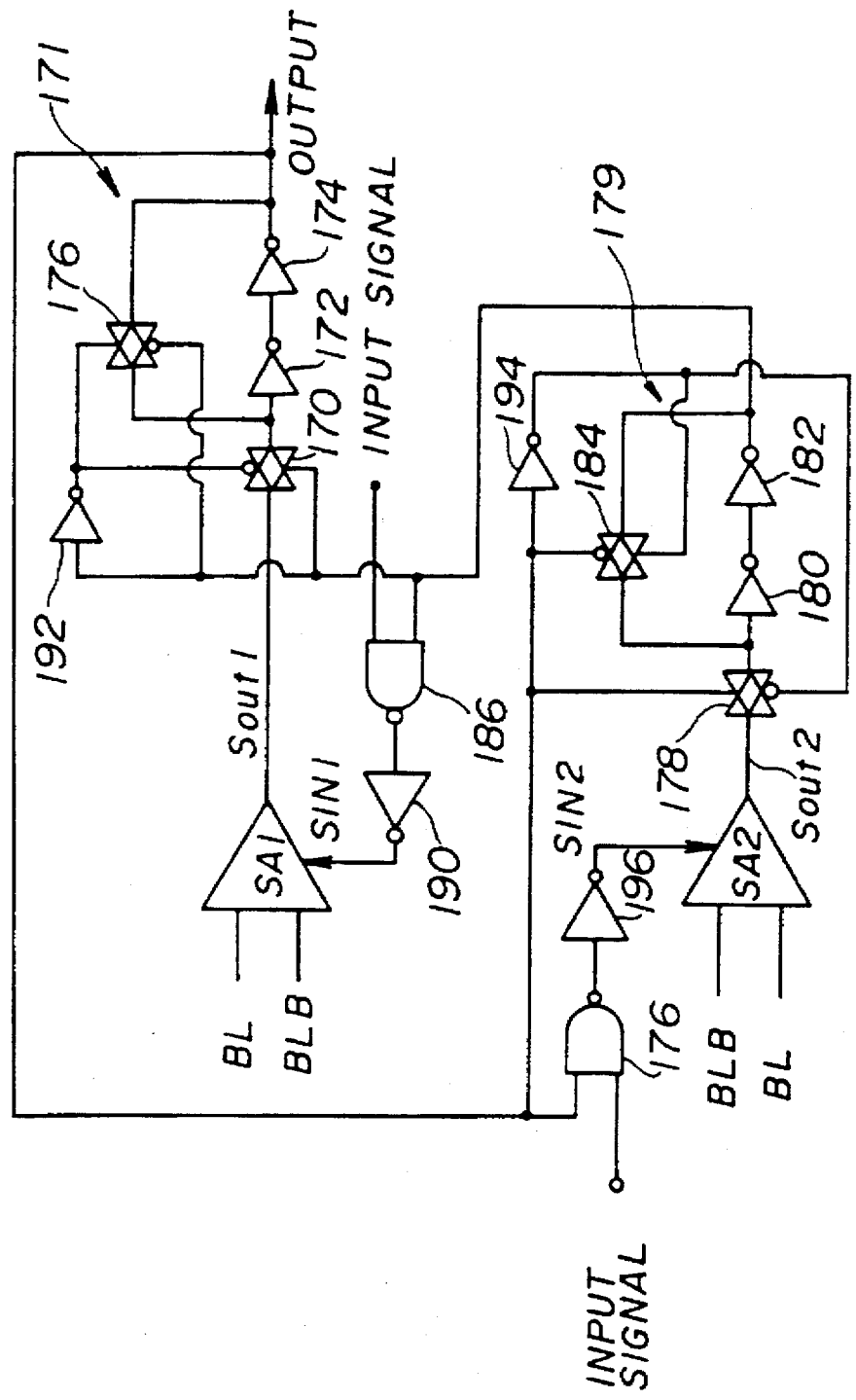
FIG. 11A shows a circuit diagram of a RAM reading circuit in a sixth embodiment of the present invention.

FIG. 11A shows a circuit diagram of a RAM reading circuit in the sixth embodiment of the present invention. FIG. 11B shows a circuit diagram of a current-mirror-type sense amplifier SA1 in the RAM reading circuit shown in FIG. 11A. Another current-mirror-type sense amplifier SA2 in the RAM reading circuit shown in FIG. 11A is identical to the sense amplifier SA1, except that bit line signals BL and BLB are replaced with one another as indicated within parentheses in the figure. The circuit shown in FIG. 11B was described above in the DESCRIPTION OF THE RELATED ART. The signal BLB is obtained as a result of inverting the signal BL. FIG. 11C shows a relationship between a logical level of an output signal Sout1 or Sout2 and a result as to whether or not a static passing-through electric current flows in the sense amplifiers SA1 and SA2. In the sense amplifier SA1, a static passing-through electric current flows therethrough when the sense amplifier SA1 reads the bit line signal BL having a High level. In the other sense amplifier SA2, a static passing-through electric current flows therethrough when the sense amplifier SA1 reads the bit line signal BL having a Low level.

With reference to FIG. 11A, a latch circuit 171 is connected to an output terminal of the sense amplifier SA1 via a transmission gate 170. The latch circuit 171 includes two stages of inverters 172, 174 which are connected in series to the output terminal of the transmission gate 170, and another transmission gate 176 which is connected between an input terminal of the first inverter 172 and an output terminal of the second inverter 174. An output signal output from the latch circuit 171 is an output signal of this RAM reading circuit.

Similarly, another latch circuit 179 is connected to an output terminal of the sense amplifier SA2 via a transmission gate 178. The latch circuit 179 includes two stages of inverters 180, 182 which are connected in series to the output terminal of the transmission gate 178, and another transmission gate 184 which is connected between an input terminal of the first inverter 180 and an output terminal of the second inverter 182. An output terminal of the latch circuit 179 is connected to one input terminal of a NAND circuit 186. A control input signal is input to the other input terminal of the NAND circuit 186. An output terminal of the NAND circuit 186 is connected to the sense amplifier SA1 via an inverter 190. A signal output from the inverter 190 is a control signal SIN1 for the sense amplifier SA1. Further, the output terminal of the latch circuit 179 is also connected to a non-inverting gate terminal of the transmission gate 170 and to an inverting gate terminal of the transmission gate 176. Further, the output terminal of the latch circuit 179 is also connected, via an inverter 192, to an inverting gate terminal of the transmission gate 170 and to a non-inverting gate terminal of the transmission gate 176. An output terminal of the latch circuit 171 is one input terminal of a NAND circuit 176. Further, the output terminal of the latch circuit 171 is also connected to a non-inverting gate terminal of the transmission gate 178 and to an inverting gate terminal of the transmission gate 184. Further, the output terminal of the latch circuit 171 is also connected, via an inverter 194, to an inverting gate terminal of the transmission gate 178 and to a non-inverting gate terminal of the transmission gate 184. Further, the above-mentioned control input signal is input also to the other input terminal of the NAND circuit 176. An output terminal of the NAND circuit 176 is connected to the sense amplifier SA2 via an inverter 196. A signal output from the NAND circuit 196 is a control signal SIN2 for the sense amplifier SA2.

The sense amplifier SA2 and the latch circuit 179 form a sense circuit. This sense circuit outputs a signal when an input signal, which tends to cause the static passing-through electric current to flow through the sense amplifier SA1, is detected. This signal output by the sense circuit then causes the sense amplifier SA1 to be in an inactive state and thereby prevents the static passing-through electric current from actually flowing through the sense amplifier SA1.

In the sixth embodiment shown in FIG. 11A, when the RAM reading circuit operates, the above-mentioned control input signal has a High level. In this condition, each of the control signals SIN1 and SIN2 for the sense amplifiers SA1 and SA2 is at a High level. Thus, the transistor 128 in each of the sense amplifiers SA1 and SA2 is in its ON state. Thus, each of the sense amplifiers SA1 and SA2 is in an active state. In this precharging state, before performing a data reading operation, each of the output signals Sout1 and Sout2 of the sense amplifiers SA1 and SA2 has a High level. This results from previously determining sizes of transistors during a design stage of each sense amplifier. When data "1" is read from a memory cell via the bit line signals BL and BLB, the bit line signal BL has a High level. In this case, the bit line signal BL has the High level while the bit line signal BLB has a Low level. As a result, the transistor 120 is in its ON state and the transistor 122 is in its OFF state in the sense amplifier SA1, while the transistor 120 is in its OFF state and the transistor 122 is in its ON state in the sense amplifier SA2. Thereby, the output signal Sout1 of the sense amplifier SA1 continues to have the High level, while the output signal Sout2 of the sense amplifier SA2 changes from the High level to a Low level.

In this state, because the transistor 120 is in the OFF state in the sense amplifier SA2 as mentioned above, each of the transistors 124 and 126 is in its OFF state in the sense amplifier SA2. As a result, a passing-through path between the power source Vcc and the ground is not formed in the sense amplifier SA2. Thereby, in the sense amplifier SA2, a static passing-through electric current does not flow as shown in FIG. 11C. In contrast to this, in this state, because the transistor 120 is in the ON state in the sense amplifier SA1 as mentioned above, each of the transistors 124 and 126 is in its ON state in the sense amplifier SA1. Further, the transistor 128 is also in the ON state. As a result, a passing-through path between the power source Vcc and the ground is formed by the transistors 124, 120 and 128 in the sense amplifier SA1. Thereby, in the sense amplifier SA1, a static passing-through electric current tends to flow as shown in FIG. 11C.

However, in this state, because the output signal Sout2 of the sense amplifier SA2 has the Low level, this Low level is transmitted to one input terminal of the NAND circuit 186 through the transmission gate 178, and inverters 180, 182. As a result, the control signal SIN1 for the sense amplifier SA1 comes to have a Low level. As a result, the transistor 128 in the sense amplifier SA1 come to be its OFF state. Thus, the sense amplifier SA1 enters an inactive state. Thereby, the passing-through path is not formed and the static passing-through electric current does not flow in the sense amplifier SA1. Further, the Low level of the output signal Sout2 of the sense amplifier SA2 is also input to the transmission gates 176 and 170 via the transmission gate 178, and the inverters 180, 182. Thereby, the transmission gate 176 is in its ON state while the transmission gate 170 is in its OFF state. Thus, the output signal Sout1 of the sense amplifier SA1 before the sense amplifier SA1 enters the inactive state is latched in the latch circuit 171.

When data "0" is read from the memory cell via the bit line signals BL and BLB, the bit line signal BL has a Low level. In this case, the bit line signal BL has the Low level while the bit line signal BLB has a High level. As a result, the transistor 120 is in its ON state and the transistor 122 is in its OFF state in the sense amplifier SA2, while the transistor 120 is in its OFF state and the transistor 122 is in its ON state in the sense amplifier SA1. Thereby, the output signal Sout2 of the sense amplifier SA2 continues to have the High level, while the output signal Sout1 of the sense amplifier SA1 changes from the High level to a Low level.

In this state, because the transistor 120 is in the OFF state in the sense amplifier SA1 as mentioned above, each of the transistors 124 and 126 is in its OFF state in the sense amplifier SA1. As a result, a passing-through path between the power source Vcc and the ground is not formed in the sense amplifier SA1. Thereby, in the sense amplifier SA1, a static passing-through electric current does not flow as shown in FIG. 11C. In this state, the High-level signal Sout2 does not cause the sense amplifier SA1 to be in the inactive state. Further, the High-level signal Sout2 does not cause the latch circuit 171 to latch the signal Sout1 output from the sense amplifier SA1.

In contrast to the above-described state in the sense amplifier SA1, in the sense amplifier SA2, because the transistor 120 is in the ON state in the sense amplifier SA2 as mentioned above, each of the transistors 124 and 126 is in its ON state. As a result, a passing-through path between the power source Vcc and the ground is formed by the transistors 124, 120 and 128 in the sense amplifier SA2. Thereby, in the sense amplifier SA2, a static passing-through electric current tends to flow as shown in FIG. 11C. However, in this state, because the output signal Sout1 of the sense amplifier SA1 has the Low level, this Low level is transmitted to one input terminal of the NAND circuit 176 through the transmission gate 170, and inverters 172, 174. As a result, the control signal SIN2 for the sense amplifier SA2 comes to have a Low level. As a result, the transistor 128 in the sense amplifier SA2 come to be its OFF state. Thus, the sense amplifier SA2 enters an inactive state. Thereby, the passing-through path is not formed and the static passing-through electric current does not flow in the sense amplifier SA2. Further, the Low level of the output signal Sout1 of the sense amplifier SA1 is also input to the transmission gates 178 and 184 via the transmission gate 170, and the inverters 172, 174. Thereby, the transmission gate 184 is in its ON state while the transmission gate 178 is in its OFF state. Thus, the output signal Sout2 of the sense amplifier SA2 before the sense amplifier SA2 enters the inactive state is latched in the latch circuit 179.

As described above, when a static passing-through electric current tends to flow in a data reading operation, the sense amplifiers SA1 and SA2 are appropriately causes to be in the inactive state and an output signal is appropriately latched. Thereby, power consumption in the sense amplifiers can be effectively reduced.

Figure 12A:
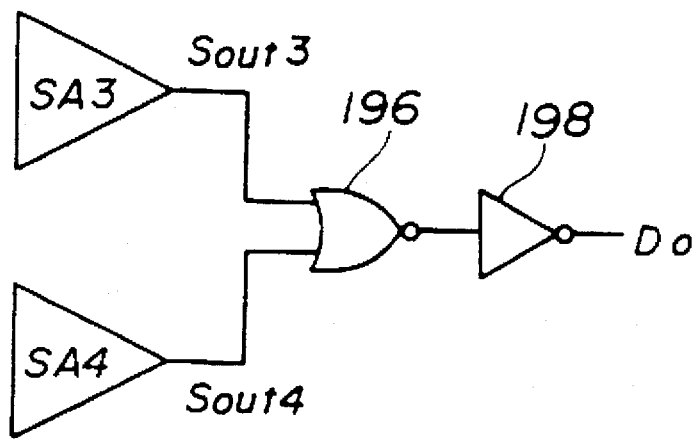
FIG. 12A shows a circuit diagram of a RAM reading circuit in a seventh embodiment of the present invention.
Figure 12B:
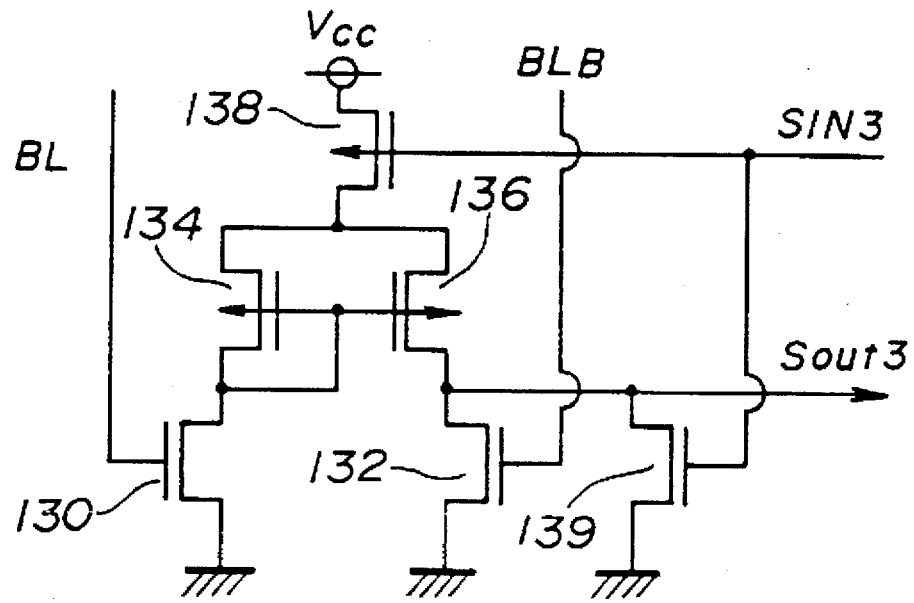
FIGS. 12B and 12C show circuit diagrams of sense amplifiers in the RAM reading circuit shown in FIG. 12A.
Figure 12C:
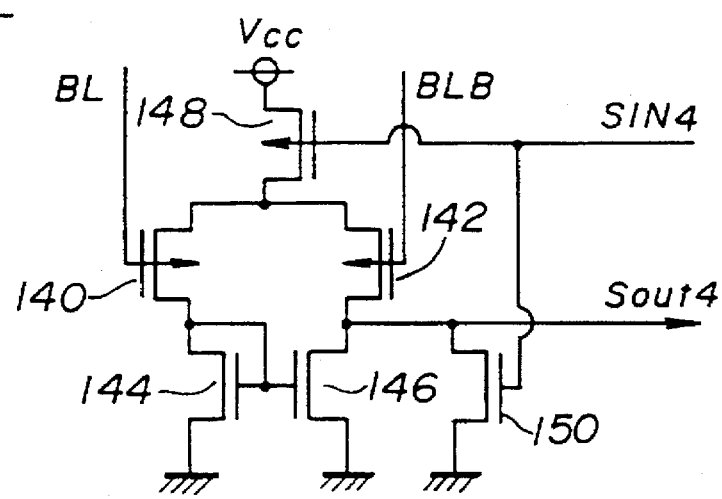
Figure 12D:
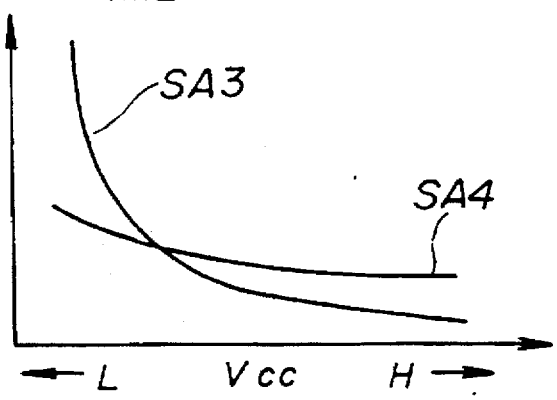
FIG. 12D illustrates operations of two sense amplifiers shown in FIGS. 12B and 12C.

A seventh embodiment of the present invention will now be described. FIG. 12A shows a circuit diagram of a RAM reading circuit in the seventh embodiment. The RAM reading circuit includes two sense amplifiers SA3 and SA4. Data reading speed characteristics of the sense amplifier SA3 is different from data reading speed characteristics of the sense amplifier SA4. Thereby, a data reading speed of the RAM reading circuit is not degraded even if a power source voltage varies. The sense amplifiers SA3 and SA4 are current-mirror-type sense amplifiers, circuit diagrams of which are shown in FIGS. 12B and 12C, respectively. As described above in the DESCRIPTION OF THE RELATED ART, depending on whether MOS transistors to which bit line signals are input from a memory cell are the N-channel ones (in the case of the sense amplifier SA3 shown in FIG. 12B) or the P-channel ones (in the case of the sense amplifier SA4 shown in FIG. 12C), as shown in FIG. 12D, a variation of a reading time resulting from a power source voltage Vcc variation is different.

Output terminals of the sense amplifiers SA3 and SA4 are input to two input terminals of a NOR circuit 196, respectively. A signal output from the NOR circuit is inverted by an inverter 198. Thus, an output signal Do is obtained from the inverter 198.

In this seventh embodiment, when data "1" is read out from a memory cell (not shown in the figures) via the bit line signals BL and BLB, the bit line signal has a High level and the bit line signal BLB has a Low level. In this case, when either one of the sense amplifiers SA3 and SA4 has a High level first, the output signal Do can be obtained from the RAM reading circuit via the NOR circuit 196. Therefore, even if the power source voltage Vcc varies and thereby a sense amplifier having a higher data reading speed changes between the two sense amplifiers SA3 and SA4, the output signal Do can be obtained always from the sense amplifier which has the higher data reading speed. Thereby, the output signal Do can always be obtained when the sense amplifier having the higher data reading speed outputs the read data. Thus, the RAM reading circuit can read data from the memory cell at a high speed even if the power source voltage Vcc varies through a wide range. In the sense amplifiers SA3 and SA4, when data is read from a memory cell, each of control signals SIN3 and SIN4 is at a Low level.

Figure 13A:
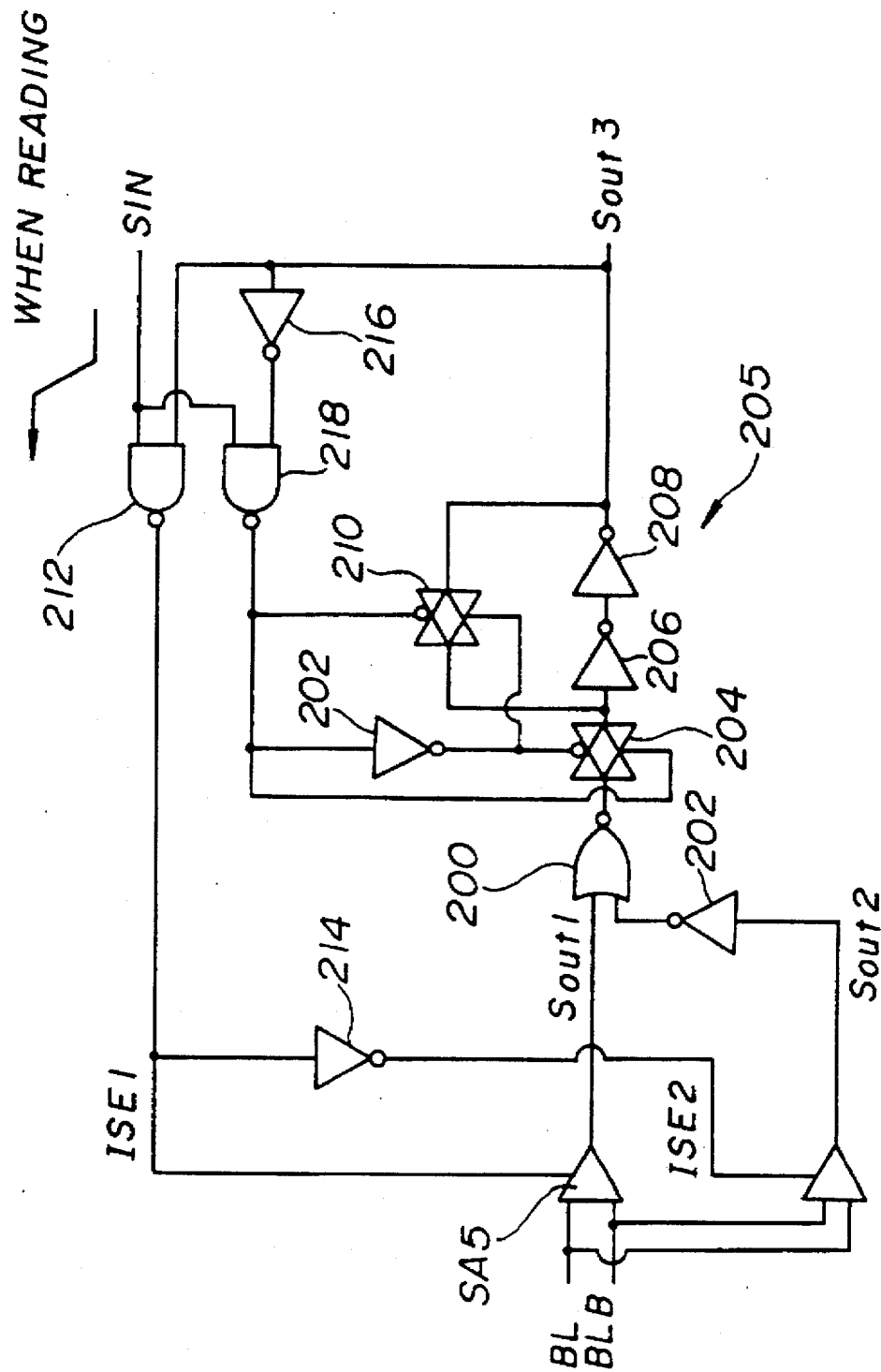
FIG. 13A shows a circuit diagram of a RAM reading circuit in an eighth embodiment of the present invention.

An eighth embodiment of the present invention will now be described. FIG. 13A shows a circuit diagram of a RAM reading circuit in the eighth embodiment of the present invention. A circuit diagram of a sense amplifier SA5 in the circuit shown in FIG. 13A is shown in FIG. 13B. This circuit shown in FIG. 13B is identical to the circuit shown in FIG. 12B. In this circuit, the bit line signals BL and BLB are input to NMOS transistors 150, 152, respectively. This sense amplifier SA5 outputs an output signal Sout1 having a Low level, when precharging. This results from previously determining sizes of transistors during a design stage of the sense amplifier.

Another sense amplifier SA6 is a current-mirror-type sense amplifier, a circuit diagram of which is shown in FIG. 13C. The circuit of the sense amplifier SA6 is obtained as a result of replacing, with respect to functions thereof in the sense amplifier, transistor types used between PMOS and NMOS types in the circuit of the sense amplifier SA5. This sense amplifier SA6 outputs an output signal Sout2 having a High level, when precharging. This results from previously determining sizes of transistors during a design stage of the sense amplifier.

FIG. 13D shows whether or not a static passing-through electric current tends to flow in a sense amplifier when data is read from the memory cell for the sense amplifiers SA5 and SA6. In the sense amplifier SA5, when data is read from the memory cell via the bit line signals BL and BLB, a PMOS transistor 158 is in its ON state. When data "1" is read, the bit line signal BL has a High level and the bit line signal BLB has a Low level. Thereby, the transistor 150 is in its ON state and the transistor 152 is in its OFF state. As a result, a transistor 154 is in its ON state. Thus, a passing-through path between a power source Vcc to the ground is formed and thus a static passing-through electric current tends to flow therethrough.

When data "0" is read in the sense amplifier SA5, the bit line signal BL has a Low level and the bit line signal BLB has a High level. Thereby, the transistor 150 is in its OFF state and the transistor 152 is in its ON state. As a result, each of transistors 154 and 156 is in its OFF state. Thus, a passing-through path between the power source Vcc to the ground is not formed and thus a static passing-through electric current does not flow therethrough.

In the sense amplifier SA6, when data is read from the memory cell via the bit line signals BL and BLB, a NMOS transistor 168 is in its ON state. When data "1" is read, the bit line signal BL has a High level and the bit line signal BLB has a Low level. Thereby, the transistor 160 is in its ON state and the transistor 162 is in its OFF state. As a result, each of transistors 164 and 166 is in its ON state. Thus, a passing-through path between a power source Vcc to the ground is formed and thus a static passing-through electric current tends to flow therethrough.

When data "0" is read in the sense amplifier SA6, the bit line signal BL has a Low level and the bit line signal BLB has a High level. Thereby, the transistor 160 is in its OFF state and the transistor 162 is in its ON state. As a result, each of transistors 164 and 166 is in its OFF state. Thus, a passing-through path between the power source Vcc to the ground is not formed and thus a static passing-through electric current does not flow therethrough.

Thus, in each of the sense amplifiers SA5 and SA6, when data "1" is read and therefore the bit line signal BL has the H level, the static passing-through electric current flows.

Further, with regard to a data reading speed, a data reading speed of the sense amplifier SA6 is higher than a data reading speed of the sense amplifier SA5 when the power source voltage Vcc is relatively low. The data reading speed of the sense amplifier SA5 is higher than the data reading speed of the sense amplifier SA6 when the power source voltage Vcc is relatively high. A reason thereof is similar to the reason (described above in the DESCRIPTION OF THE RELATED ART) of difference in the data reading speed characteristics between the SA3 and SA4 shown in FIG. 12D.

An output terminal of the sense amplifier SA5 is connected to one input terminal of a NOR circuit 200. An output terminal of the sense amplifier SA6 is connected to the other input terminal of a NOR circuit 200 via an inverter 202. An output terminal of the NOR circuit 200 is connected to a latch circuit 205 via a transmission gate 204. The latch circuit 205 includes two stages of inverters 206, 208 and a transmission gate 210 connected between an input terminal of the first inverter 206 and an output terminal of the second inverter 208. A signal Sout3 output from the latch circuit 205 is an output signal of this RAM reading circuit.

In order to prevent a static passing-through electric current from flowing through the sense amplifiers SA5 and SA6, the output signal Sout3 is input to the sense amplifier SA5 as a control signal ISE1 via a NAND circuit 212. Further, the output signal Sout3 is input to the sense amplifier SA6 as a control signal ISE2 via the NAND circuit 212 and an inverter 214. Further, the output signal Sout3 is input, via an inverter 216 and a NAND circuit 218, to a non-inverting gate terminal of the transmission gate 204 and an inverting gate terminal of the transmission gate 210. Further, an output terminal of the NAND circuit 218 is connected, via an inverter 202, to an inverting gate terminal of the transmission gate 204 and a non-inverting gate terminal of the transmission gate 210. A reading control signal SIN, which has a High level when data is read from a memory cell, is input to the other input terminal of each of the NAND circuits 212 and 218.

In the RAM reading circuit in the eighth embodiment shown in FIGS. 13A, when data "1" is read from the memory cell and the bit line signal BL has the High level, each of the output signals Sout1 and Sout2 of the sense amplifiers SA5 and SA6 has a High level. When either one between the two sense amplifiers SA5 and SA6 first having the High level has the High level, this High-level signal is inverted by the NOR circuit 200, passes through the transmission gate 204 and the latch circuit 205, and is output as the output signal Sout3 at the Low level. Thus, the RAM reading circuit can read data from the memory cell at high speed even if the power source voltage Vcc varies through a wide range.

Further, when either one of the sense amplifiers SA5 and SA6 reads data "1" from the memory cell, the read data is latched by the latch circuit 205, also the control signal SE1 is caused to be at the High level and the control signal SE2 is caused to be at the Low level, whereby each of the two sense amplifiers SA5 and SA6 are caused to be in the inactive state. Thus, power consumption in the RAM reading circuit can be effectively reduced.

Further, the present invention is not limited to the above-described embodiments, and variations and modifications may be made without departing from the scope of the present invention.

What is claimed is:

1. A sense amplifier comprising:

state control means for setting a sense amplifier portion in an active state or an inactive state;

gated feedback means responsive to an output of said sense amplifier portion and a clock signal and providing a control signal for causing said control means to set said sense amplifier portion in the inactive state when a path is formed between a power source and a ground in said sense amplifier portion; and latch means for holding said output of said sense amplifier portion when said path is formed.

2. The sense amplifier according to claim 1, wherein:

said state control means comprises a first transistor acting as a switching device; and said feedback means produces a control signal using an output of said sense amplifier portion and a clock signal obtained from a detection circuit, and supplies said control signal to said first transistor.

3. The sense amplifier according to claim 2, wherein a second transistor for precharging is connected between said first transistor and said power source.

4. The sense amplifier according to claim 1, wherein:

said state control means comprises a transistor acting as a switching device; and said feedback means produces a control signal using an output of said sense amplifier portion and a chip enable signal, and supplies said control signal to said transistor.

5. A sense amplifier comprising:

a state control portion coupled to a sense amplifier portion, said state control portion being configured to set the sense amplifier portion in one of an active or inactive state, said state control portion having an input coupled to an output of said sense amplifier portion as a feedback path, and providing a control signal to said sense amplifier portion so as to set said sense amplifier portion to said inactive state when an electrical path is formed between a power source and ground in said sense amplifier portion;

a precharging portion coupled to said sense amplifier portion such that when said sense amplifier portion is in said inactive state said precharging portion precharges said sense amplifier portion; and an output holding portion having an input coupled to said output of said sensing amplifier portion, said output holding portion being responsive to said formation of said electrical path such that said output of said sensing amplifier portion is held when said path is formed.

6. The sense amplifier according to claim 5, wherein said feedback path includes a gating circuit, and wherein said control signal is provided through said gating circuit in response to said output of said sense amplifier portion and a clock signal obtained from a detection circuit.

7. The sense amplifier according to claim 5, wherein said state control portion comprises a switching transistor having an input coupled to said feedback path and an output coupled to said sense amplifier portion.

8. The sense amplifier according to claim 5, wherein said precharging portion comprises a transistor connected between an input of said sense amplifier portion and the power source.

9. The sense amplifier according to claim 5, wherein said state control portion includes a transistor and said feedback path provides said control signal using an output of said sense amplifier portion and a chip enable signal, and supplies said control signal to said transistor.

* * * * *